US012588390B2

(12) United States Patent
Kim et al.

(10) Patent No.: US 12,588,390 B2
(45) Date of Patent: Mar. 24, 2026

(54) DISPLAY DEVICE INCLUDING ALTERNATING PIXELS AND OPTICAL SENSORS

(71) Applicant: SAMSUNG DISPLAY CO., LTD., Yongin-si (KR)

(72) Inventors: Il Nam Kim, Hwaseong-si (KR); Seung Hyun Moon, Suwon-si (KR); Dong Wook Yang, Suwon-si (KR); Hyun Dae Lee, Hwaseong-si (KR); Kang Bin Jo, Suwon-si (KR); Go Eun Cha, Suwon-si (KR); Hee Chul Hwang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 453 days.

(21) Appl. No.: 18/093,914

(22) Filed: Jan. 6, 2023

(65) Prior Publication Data

US 2023/0320168 A1      Oct. 5, 2023

(30) Foreign Application Priority Data

Apr. 5, 2022      (KR) ........................ 10-2022-0042000

(51) Int. Cl.
*H10K 59/65*          (2023.01)
*G06V 40/13*          (2022.01)
(Continued)

(52) U.S. Cl.
CPC ......... *H10K 59/65* (2023.02); *G06V 40/1318* (2022.01); *H10K 59/122* (2023.02); (Continued)

(58) Field of Classification Search
CPC .... H10K 59/65; H10K 59/122; H10K 59/131; H10K 59/40; H10K 59/873; (Continued)

(56) References Cited

U.S. PATENT DOCUMENTS 9,342,733 B2      5/2016 Lee et al.
10,203,816 B2    2/2019 Nelson et al.
(Continued)

FOREIGN PATENT DOCUMENTS

CN          112310153 A   *   2/2021   ............. H04N 23/57
CN          113130602 A   *   7/2021   ............... H04R 7/04
(Continued)

*Primary Examiner* — Ida M Soward
(74) *Attorney, Agent, or Firm* — F. CHAU & ASSOCIATES, LLC

(57) ABSTRACT
A display device includes a substrate having an active region and a first non-active region positioned around the active region. A plurality of pixels is disposed in the active region and emits light. A light source unit is disposed in the first non-active region and emits light. A plurality of optical sensors is disposed in the active region and senses incident light emitted by the light source unit. An encapsulation layer is disposed on the plurality of pixels, the plurality of optical sensors, and the light source unit. A scattering pattern layer is disposed on the encapsulation layer in the first non-active region and includes a plurality of holes.

20 Claims, 16 Drawing Sheets

(51) Int. Cl.

| | |
|---|---|
| *H10K 59/122* | (2023.01) |
| *H10K 59/131* | (2023.01) |
| *H10K 59/40* | (2023.01) |
| *H10K 59/80* | (2023.01) |

(52) U.S. Cl.
CPC ........... *H10K 59/131* (2023.02); *H10K 59/40* (2023.02); *H10K 59/873* (2023.02); *H10K 59/877* (2023.02)

(58) Field of Classification Search
CPC .. H10K 59/877; H10K 59/8792; H10K 59/60; H10K 59/12; H10K 59/124; H10K 50/805; H10K 50/844; H10K 50/854; H10K 50/865; G06V 40/1318
See application file for complete search history.

(56) References Cited

U.S. PATENT DOCUMENTS

| | | | |
|---|---|---|---|
| 10,437,974 B2 | 10/2019 | He et al. | |
| 11,392,255 B2 * | 7/2022 | Bang | H10K 59/40 |
| 2020/0409509 A1 * | 12/2020 | Bok | G06F 3/04164 |
| 2021/0064159 A1 | 3/2021 | Yeke Yazdandoost et al. | |
| 2021/0200366 A1 * | 7/2021 | Bok | G06V 10/17 |
| 2021/0255506 A1 * | 8/2021 | Wu | H10K 77/111 |
| 2021/0273021 A1 * | 9/2021 | Lee | H10K 59/8792 |
| 2021/0366999 A1 * | 11/2021 | Sung | H10K 71/00 |
| 2022/0214758 A1 * | 7/2022 | Cheng | G06F 3/042 |
| 2022/0285460 A1 * | 9/2022 | Kim | H10K 59/40 |
| 2022/0336536 A1 * | 10/2022 | Kwon | G06F 3/0412 |
| 2022/0336781 A1 * | 10/2022 | Hong | H10K 50/865 |
| 2022/0359628 A1 * | 11/2022 | Choi | H10K 50/16 |
| 2023/0329066 A1 | 10/2023 | Lee et al. | |

FOREIGN PATENT DOCUMENTS

| | | | | |
|---|---|---|---|---|
| CN | 113206134 A * | 8/2021 | | H10K 50/844 |
| KR | 10-2021-0043892 | 4/2021 | | |
| KR | 10-2023-0144172 | 10/2023 | | |
| WO | 2020-165686 | 8/2020 | | |
| WO | WO-2022046025 A1 * | 3/2022 | | H10K 59/8791 |

* cited by examiner

LS: BM, H2

LS: BM, H2

1

DISPLAY DEVICE INCLUDING ALTERNATING PIXELS AND OPTICAL SENSORS

CROSS-REFERENCE TO RELATED APPLICATION

This application claims priority under 35 U.S.C. § 119 to Korean Patent Application No. 10-2022-0042000, filed on Apr. 5, 2022 in the Korean Intellectual Property Office, the disclosure of which is incorporated by reference in its entirety herein.

1. TECHNICAL FIELD

The present disclosure relates to a display device.

2. DISCUSSION OF RELATED ART

The demand for a display device for displaying an image in various forms has increased as the information society develops. For example, display devices are applied to various different electronic devices, such as smart phones, digital cameras, notebook computers, navigation systems, smart watches, and smart televisions. The display device may be a flat panel display device such as a liquid crystal display device, a field emission display device, or an organic light emitting display device.

The electronic device having a display device applied thereto may also include various sensors, such as an optical sensor for touch recognition or fingerprint recognition. Research and development is being conducted concerning the integration of pixels for displaying an image on a display panel and optical sensors for touch recognition or fingerprint recognition.

SUMMARY

Aspects of embodiments of the present disclosure provide a display device capable of securing an arrangement region for pixels and optical sensors by disposing a light source unit functioning as a light source of the optical sensor in a non-active region.

However, aspects of the present disclosure are not restricted to those set forth herein. The above and other aspects of the present disclosure will become more apparent to one of ordinary skill in the art to which the present disclosure pertains by referencing the detailed description of embodiments of the present disclosure given below.

According to an embodiment of the present disclosure, a display device includes a substrate having an active region and a first non-active region positioned around the active region. A plurality of pixels is disposed in the active region and emits light. A light source unit is disposed in the first non-active region and emits light. A plurality of optical sensors is disposed in the active region and senses incident light emitted by the light source unit. An encapsulation layer is disposed on the plurality of pixels, the plurality of optical sensors, and the light source unit. A scattering pattern layer is disposed on the encapsulation layer in the first non-active region and includes a plurality of holes.

In an embodiment, the plurality of pixels may emit light in a wavelength band of visible light, and the light source unit emits light in an infrared wavelength band.

In an embodiment, the plurality of optical sensors may detect the light in the infrared wavelength band.

In an embodiment, the scattering pattern layer may overlap the light source unit in a thickness direction of the substrate.

In an embodiment, the display device may further comprise a touch sensing layer disposed on the encapsulation layer in the active region. The touch sensing layer includes touch electrodes. The scattering pattern layer may be formed of a same layer as the touch sensing layer.

In an embodiment, the scattering pattern layer may include metal patterns disposed between the plurality of holes, and each of the metal patterns may include a same material as the touch electrode of the touch sensing layer.

In an embodiment, the scattering pattern layer may include light blocking patterns disposed between the plurality of holes.

In an embodiment, the scattering pattern layer may include a first scattering pattern layer having metal patterns and a second scattering pattern layer disposed on the first scattering pattern layer and having light blocking patterns. The metal patterns of the first scattering pattern layer are disposed on a first region of the first non-active region and the light blocking patterns of the second scattering pattern layer are disposed on a second region of the first non-active region that is different from the first region.

In an embodiment, the first scattering pattern layer and the second scattering pattern layer may not overlap each other in a thickness direction of the substrate.

In an embodiment, the display device may further comprise a second non-active region disposed outside the first non-active region. The encapsulation layer may include a first encapsulation inorganic layer, an encapsulation organic layer on the first encapsulation inorganic layer, and a second encapsulation inorganic layer on the encapsulation organic layer. The second non-active region may include an inorganic contact region having the first encapsulation inorganic layer and the second encapsulation inorganic layer in direct contact with each other.

In an embodiment, the display device may further comprise a dam region having at least one dam disposed between the first non-active region and the second non-active region.

In an embodiment, the display device may further comprise a light source voltage line applying a light source voltage to the light source unit. The light source voltage line may be disposed in the first non-active region.

In an embodiment, the first non-active region may further include a scan driver applying a scan signal to the plurality of pixels, and the scan driver may overlap the light source unit in a thickness direction of the substrate.

In an embodiment, the light source unit may surround at least three sides of the active region.

According to an embodiment of the present disclosure, a display device includes a substrate including an active region and a first non-active region positioned around the active region. A plurality of pixels is disposed in the active region and emits light. A light source unit is disposed in the first non-active region and emits light. A plurality of optical sensors is disposed in the active region and senses incident light emitted by the light source unit. An encapsulation layer is disposed on the plurality of pixels, the plurality of optical sensors, and the light source unit. The plurality of pixels emits light in a wavelength band of visible light, and the light source unit emits light in a wavelength band different from the wavelength band of visible light.

In an embodiment, the light source unit may emit light in an infrared wavelength band, and the plurality of optical sensors detects the light in the infrared wavelength band.

According to an embodiment of the present disclosure, a display device includes a substrate. A pixel electrode, a sensing electrode and a first electrode is on the substrate. A pixel defining layer exposes the pixel electrode, the sensing electrode and the first electrode. A first light emitting layer is on the pixel electrode. A photoelectric conversion layer is on the sensing electrode. A second light emitting layer is on the first electrode. A common electrode is disposed on the first light emitting layer, the photoelectric conversion layer, the second light emitting layer and the pixel defining layer. The second light emitting layer includes a material different from that of the first light emitting layer.

In an embodiment, the display device may further comprise an encapsulation layer on the common electrode. A scattering pattern layer is on the encapsulation layer. The scattering pattern layer may overlap the second light emitting layer in a thickness direction of the substrate.

In an embodiment, a thickness of the first light emitting layer may be less than a thickness of the second light emitting layer.

In an embodiment, a thickness of the common electrode disposed on the first light emitting layer may be less than a thickness of the common electrode disposed on the second light emitting layer.

According to the display device according to embodiments of the present disclosure, since it is possible to secure an arrangement region for the pixels and the optical sensors by arranging the light source unit functioning as the light source of the optical sensor in the non-active region, it is possible to prevent a reduction in the resolution of displaying an image and a reduction in an optical detection accuracy.

However, the effects of embodiments of the present disclosure are not restricted to the one set forth herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

Figure 1:
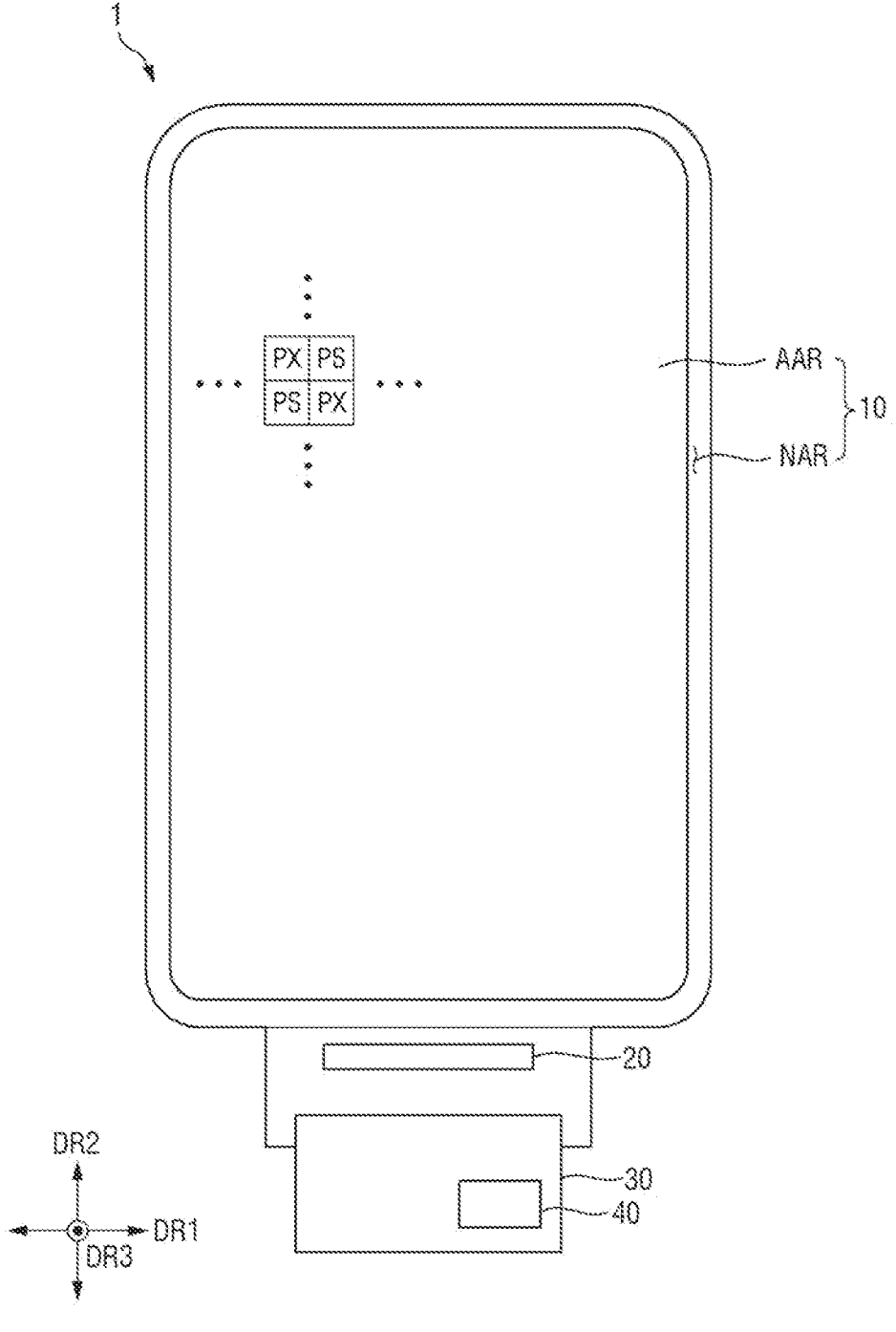
FIGS. 1 and 2 are plan views illustrating a display device according to embodiments of the present disclosure.

Embodiments of the present disclosure will now be described more fully hereinafter with reference to the accompanying drawings. The present disclosure may, however, be embodied in different forms and should not be construed as limited to the embodiments set forth herein. The same reference numbers indicate the same components throughout the specification. In the attached drawing figures, the thickness of layers and regions may be exaggerated for clarity purposes.

It will be understood that, although the terms "first," "second," "third" etc. may be used herein to describe various elements, components, regions, layers and/or sections, these elements, components, regions, layers and/or sections should not necessarily be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, may be expected. Thus, embodiments described herein should not be construed as necessarily limited to the particular shapes of regions as illustrated herein but are to include deviations in shapes that result, for example, from manufacturing. A region illustrated or described as flat may, typically, have rough and/or non-linear features, for example. Additionally, sharp angles that are illustrated may be rounded. Thus, the regions illustrated in the drawing figures may be schematic in nature and their shapes may not illustrate the precise shape of a region and are not intended to limit the scope of the claims Hereinafter, embodiments of the present disclosure will be described with reference to the accompanying drawings.

Figure 2:
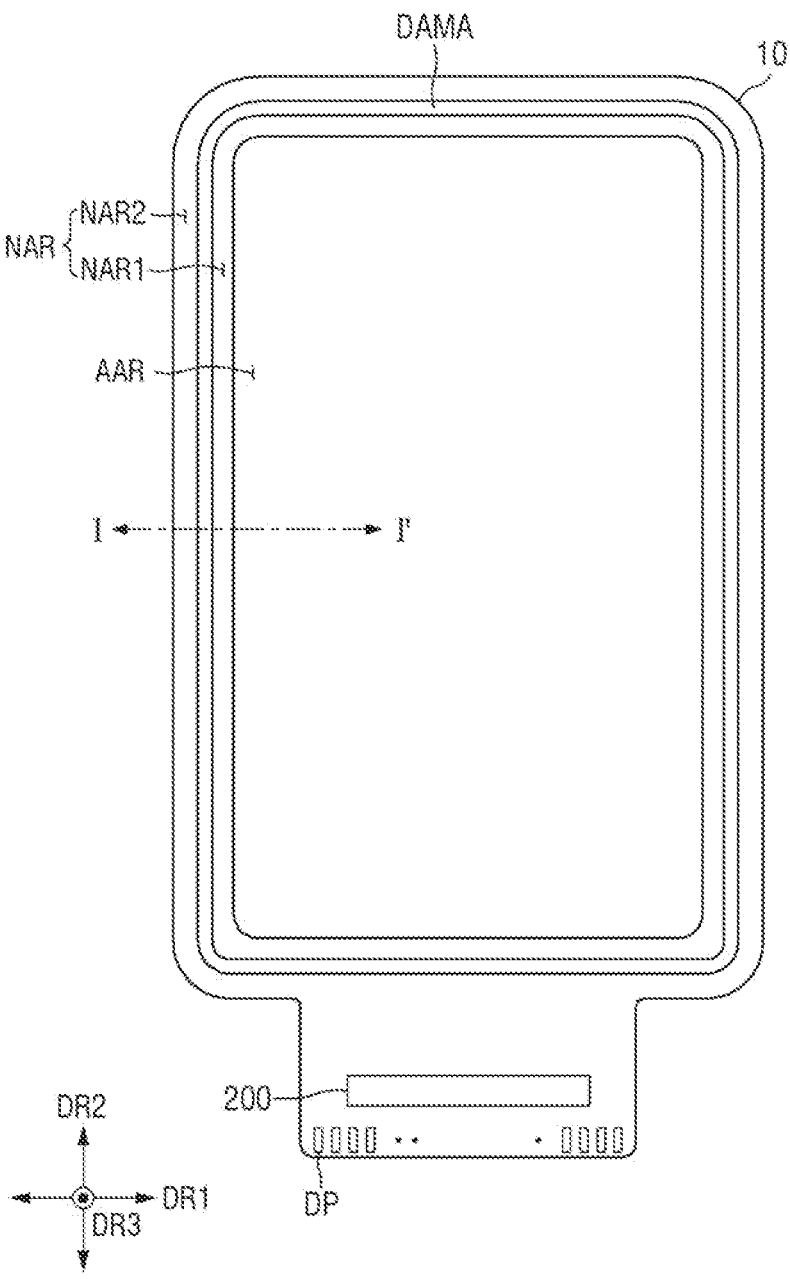

FIGS. 1 and 2 are plan views illustrating a display device according to embodiments of the present disclosure.

In FIGS. 1 and 2, a first direction DR1, a second direction DR2, and a third direction DR3 are indicated. The first direction DR1 may be a direction parallel to one side of a display device 1 when viewed on a plane, for example, a horizontal direction of the display device 1. The second direction DR2 may be a direction parallel to the other side in contact with one side of the display device 1 when viewed on a plane, and may be a vertical direction of the display device 1. Hereinafter, for convenience of explanation, one side in the first direction DR1 refers to a right direction in plan view and the other side in the first direction DR1 refers to a left direction in plan view, and one side in the second direction DR2 refers to an upward direction in plan view and the other side in the second direction DR2 refers to a downward direction in plan view. The third direction DR3 may be a thickness direction of the display device 1. However, it should be understood that the directions mentioned in embodiments refer to relative directions, and embodiments of the present disclosure are not necessarily limited to the mentioned directions.

Unless otherwise defined, in the present specification, "upper side" and "top surface" expressed with respect to the third direction DR3 refer to a side of a display surface with respect to the display panel 10, and "lower side", "bottom surface", and "rear surface" expressed with respect to the third direction DR3 refer to an opposite side of the display surface with respect to the display panel 10.

Referring to FIG. 1, the display device 1 may include various electronic devices that provide a display screen. Examples of the display device 1 may include, but are not necessarily limited to, mobile phones, smartphones, tablet personal computers (PCs), mobile communication terminals, electronic notebooks, e-books, personal digital assistants (PDAs), portable multimedia players (PMPs), navigation, ultra mobile PCs (UMPCs), televisions, game machines, wrist watch-type electronic devices, head-mounted displays, monitors of personal computers, laptop computers, vehicle instrument boards, digital cameras, camcorders, external billboards, electric signs, various medical devices, various inspection devices, various home appliances including a display region such as refrigerators and washing machines, or Internet of Things (IoT) devices. Representative examples of the display device 1 to be described later include, but are not necessarily limited to, a smart phone, a tablet PC, or a notebook computer.

The display device 1 may include a display panel 10, a display driving circuit 20, a circuit board 30, and a readout circuit 40.

The display device 1 includes the display panel 10 having an active region AAR and a non-active region NAR. The active region AAR includes a display region on which an image is displayed. In an embodiment, the active region AAR may completely overlap the display region. A plurality of pixels PX displaying an image may be disposed in the display region. Each pixel PX may include a light emitting element (LEL in FIG. 5).

In addition, the active region AAR further includes a fingerprint sensing region. The fingerprint sensing region is a region that responds to light, and is a region configured to sense the amount or wavelength of incident light. The fingerprint sensing region may overlap the display region. For example, in an embodiment the fingerprint sensing region may be defined as a region exactly the same as the active region AAR. In this embodiment, a front surface of the active region AAR may be utilized as a region for fingerprint sensing. A plurality of optical sensors PS that respond to light may be disposed in the fingerprint sensing region. Each optical sensor PS may include a photoelectric conversion element (PD in FIG. 5) that senses incident light and converts the sensed incident light into an electrical signal.

The non-active region NAR is disposed around the active region AAR (e.g., in the first and/or second directions DR1, DR2). The non-active region NAR may be a bezel region. In an embodiment, the non-active region NAR may surround all sides (four sides in the drawing) of the active region AAR. However, embodiments of the present disclosure are not necessarily limited thereto. For example, the non-active region NAR may not surround at least one side of the active region AAR in some embodiments.

The non-active region NAR may be disposed around the active region AAR. The display driving circuit 20 may be disposed in the non-active region NAR. The display driving circuit 20 may output signals and voltages for driving a plurality of pixels PX and/or a plurality of optical sensors PS. In an embodiment, the display driving circuit 20 may be formed as an integrated circuit (IC) and mounted on the display panel 10. Signal lines for transmitting signals between the display driving circuit 20 and the active region AAR may be further disposed in the non-active region NAR.

In addition, the readout circuit 40 may be disposed in the non-active region NAR. The readout circuit 40 may be connected to each of the optical sensors PS through the signal lines, and may receive a current flowing through each of the optical sensors PS to sense a user's fingerprint input. In an embodiment, the readout circuit 40 may be formed as an integrated circuit (IC) and attached onto the display circuit board in a chip on film (COF) method. However, embodiments of the present disclosure are not necessarily limited thereto. For example, the readout circuit 40 in some embodiments may also be attached onto the non-active region NAR of the display panel 10 by a chip on glass (COG) method, a chip on plastic (COP) method, or an ultrasonic bonding method.

In an embodiment, the circuit board 30 may be attached to one end of the display panel 10 using an anisotropic conductive film (ACF). Lead lines of the circuit board 30 may be electrically connected to display pads (DP of FIG. 2) of the display panel 10. In an embodiment, the circuit board 30 may be a flexible film such as a flexible printed circuit board or a chip on film.

Referring to FIG. 2, the non-active region NAR may include a first non-active region NAR1 and a second non-active region NAR2. The first non-active region NAR1 may be disposed to surround the active region AAR (e.g., in the first and/or second directions DR1, DR2). The second non-active region NAR2 may be disposed outside the first non-active region NAR1 (e.g., in the first and/or second directions DR1, DR2)

A dam region DAMA may be disposed between the first non-active region NAR1 and the second non-active region NAR2. The dam region DAMA may be disposed to surround the active region AAR and the first non-active region NAR1. The dam region DAMA may be a region in which a dam (DAM in FIG. 9) is disposed for preventing an encapsulation organic layer TFE2 of the encapsulation layer (TFEL in FIG. 9) for encapsulating light emitting element in the active region AAR from overflowing.

The first non-active region NAR1 may be a region in which a light emitting unit, such as a light source unit (300 in FIG. 3) serving as a light source of the optical sensor PS is disposed. The second non-active region NAR2 may include an inorganic contact region in which a first encapsulation inorganic layer TFE and a second encapsulation inorganic layer TFE3 of the encapsulation layer TFEL are in direct contact with each other. The second non-active region NAR2 may be a region in which only an inorganic layer is disposed and an organic layer is not disposed.

Figure 3:
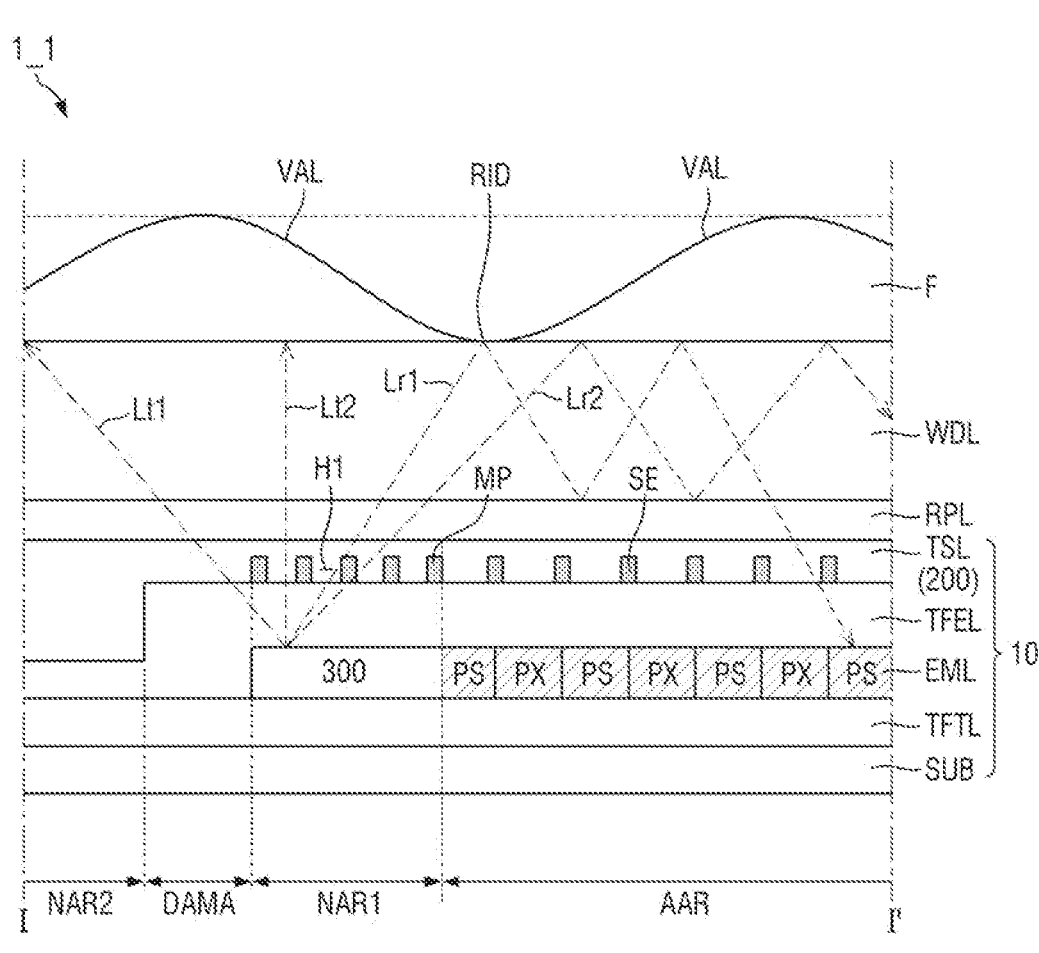
FIG. 3 is a cross-sectional view taken along line I-I' of FIG. 2 according to an embodiment of the present disclosure.

FIG. 3 is a cross-sectional view taken along line I-I' of FIG. 2 according to an embodiment of the present disclosure.

Referring to FIG. 3, the display panel 10 may include a substrate SUB, a thin film transistor layer TFTL disposed on the substrate SUB, a light emitting element layer EML, an encapsulation layer TFEL, and a touch sensing layer TSL. A display device 1_1 according to an embodiment may further include an anti-reflection layer RPL and a window WDL disposed on the display panel 10.

The substrate SUB may be a rigid substrate or a flexible substrate capable of being bent, folded, rolled, or the like. In an embodiment, the substrate SUB may be made of an insulating material such as glass, quartz, or a polymer resin. However, embodiments of the present disclosure are not necessarily limited thereto.

The thin film transistor layer TFTL disposed on the substrate SUB may include a plurality of thin film transistors driving the pixel PX and the optical sensor PS, a plurality of display signal lines, and a plurality of readout lines. The plurality of display signal lines may include a scan line transmitting a scan signal to each pixel and a data line transmitting a data signal to each pixel. The plurality of readout lines may transmit a sensing current generated from each optical sensor.

The light emitting element layer EML disposed on one surface of the thin film transistor layer TFTL may include light emitting elements (LEL in FIG. 5) of the pixels PX that emit light and photoelectric conversion elements (PD in FIG. 5) of the optical sensors PS, which are disposed in the active region AAR. The light emitting element layer EML may include a light source unit 300 disposed in the first non-active region NAR1 to emit light.

Each of the light emitting elements LEL may emit light with a predetermined luminance according to an anode voltage and a cathode voltage applied from the thin film transistor layer TFTL. Each of the photoelectric conversion elements PD may generate photocharges in proportion to incident light. The light incident on the photoelectric conversion element PD may be light of an infrared wavelength band. The accumulated photocharges may be converted into an electrical signal required for sensing according to the anode voltage and the cathode voltage applied from the thin film transistor layer TFTL. The light source unit 300 may emit predetermined light according to a light source voltage applied to a light source voltage line connected from the display driving circuit 20 and a cathode voltage. For example, the light source unit 300 may be formed as an element including an anode electrode, an organic light emitting layer, and a cathode electrode. The light source unit 300 may emit light of an infrared wavelength band. However, embodiments of the present disclosure are not necessarily limited thereto.

The encapsulation layer TFEL may be disposed on an upper side of the light emitting element layer EML. The encapsulation layer TFEL may include a stacked layer of an inorganic layer or an organic layer to prevent moisture or oxygen from permeating into the light emitting elements of the light emitting element layer EML. The dam of the dam region DAMA may prevent the organic layer of the encapsulation layer TFEL from overflowing, such as overflowing into the second non-active region NAR2. The inorganic layers of the encapsulation layer TFEL may be in direct contact with each other in the second non-active region NAR2.

The touch sensing layer TSL may be disposed on an upper side of the encapsulation layer TFEL. The touch sensing layer TSL may include a plurality of touch electrodes SE and a plurality of signal lines (TL and RL in FIG. 6) for sensing a user's touch. The touch electrodes SE may be disposed in the active region AAR.

A first scattering pattern layer 200 formed of the same layer as the touch sensing layer TSL may be disposed on (e.g., disposed directly thereon) an upper side of the encapsulation layer TFEL disposed in the first non-active region NAR1. The first scattering pattern layer 200 may include metal patterns MP. In an embodiment, the metal patterns MP may be formed of the same material and by the same process as that of the touch electrode SE. The first scattering pattern layer 200 may include a plurality of first holes H1, and the metal patterns MP may be disposed to be spaced apart from each other by the first holes H1. The first scattering pattern layer 200 may overlap the light source unit 300 in the third direction DR3.

The anti-reflection layer RPL may be disposed on (e.g., disposed directly thereon) an upper side of the touch sensing layer TSL. The anti-reflection layer RPL may prevent deterioration in image visibility of the display panel 10 due to reflection of external light. The anti-reflection layer RPL may include a retardation film such as a linear polarizing plate.

The window WDL may be disposed on (e.g., disposed directly thereon) an upper side of the anti-reflection layer RPL. The window WDL may be a protective member disposed on an optical adhesive layer OCL to protect the configuration of the display device 1_1. In an embodiment, the window WDL may be made of glass or plastic. In an embodiment, the window WDL may be attached onto the anti-reflection layer RPL by an optically transparent adhesive or the like.

FIG. 3 is a cross-sectional view illustrating a state in which a user's finger is in direct contact with the window WDL of the display device 1_1. Fingerprint F includes ridges RID having a specific pattern and valleys VAL between the ridges RID.

Lights Lt1, Lt2, Lr1, and Lr2 output from the light source unit 300 may be transmitted through a top surface of the window WDL or may be totally reflected from the top surface of the window WDL. The lights Lr1 and Lr2 that are totally reflected from the top surface of the window WDL may be reflected by the valley VAL and the ridge RID. In this embodiment, the ridge RID portion of the fingerprint F is in direct contact with the top surface of the window WDL, whereas the valley VAL portion of the fingerprint F is not in direct contact with the window WDL. Accordingly, the amount of first total reflection light Lr1 that is the light reflected from the ridge RID of the fingerprint F may be different from the amount of second total reflection light Lr2 that is the light reflected from the valley VAL. Accordingly, the ridge RID portion and the valley VAL portion of the fingerprint F may be derived based on a difference in the amount of reflected light, such as light incident on the optical sensor PS. Since the optical sensor PS outputs an electrical signal (e.g., photocurrent) according to the difference in the amount of light, a pattern of the fingerprint F of the finger may be identified.

The first scattering pattern layer 200 may reduce the amount of transmitted lights Lt1 and Lt2 transmitted through the window WDL among the lights Lt1, Lt2, Lr1, and Lr2 output from the light source unit 300. The metal patterns MP of the first scattering pattern layer 200 may scatter the transmitted lights Lt1 and Lt2. Accordingly, the light scattered by the metal pattern MP may be totally reflected, so that the amount of total reflection lights Lr1 and Lr2 may increase. Since the total reflection lights Lr1 and Lr2 contribute to the formation of the electrical signal of the optical sensor PS, a fingerprint detection accuracy of the display device 1_1 may increase.

In an embodiment, the transmitted lights Lt1 and Lt2 may include second transmitted light Lt2 that vertically transmits (e.g., in the third direction DR3) through the top surface of the window WDL and first transmitted light Lt1 that transmits through the top surface of the window WDL at a predetermined angle. In an embodiment, a reflector capable of reflecting the first transmitted light Lt1 is disposed on a side surface of the window WDL. Therefore, the first transmitted light Lt1 may also be changed to light contributing to total reflection. Accordingly, the fingerprint detection accuracy of the display device 1_1 may increase.

Figure 4:
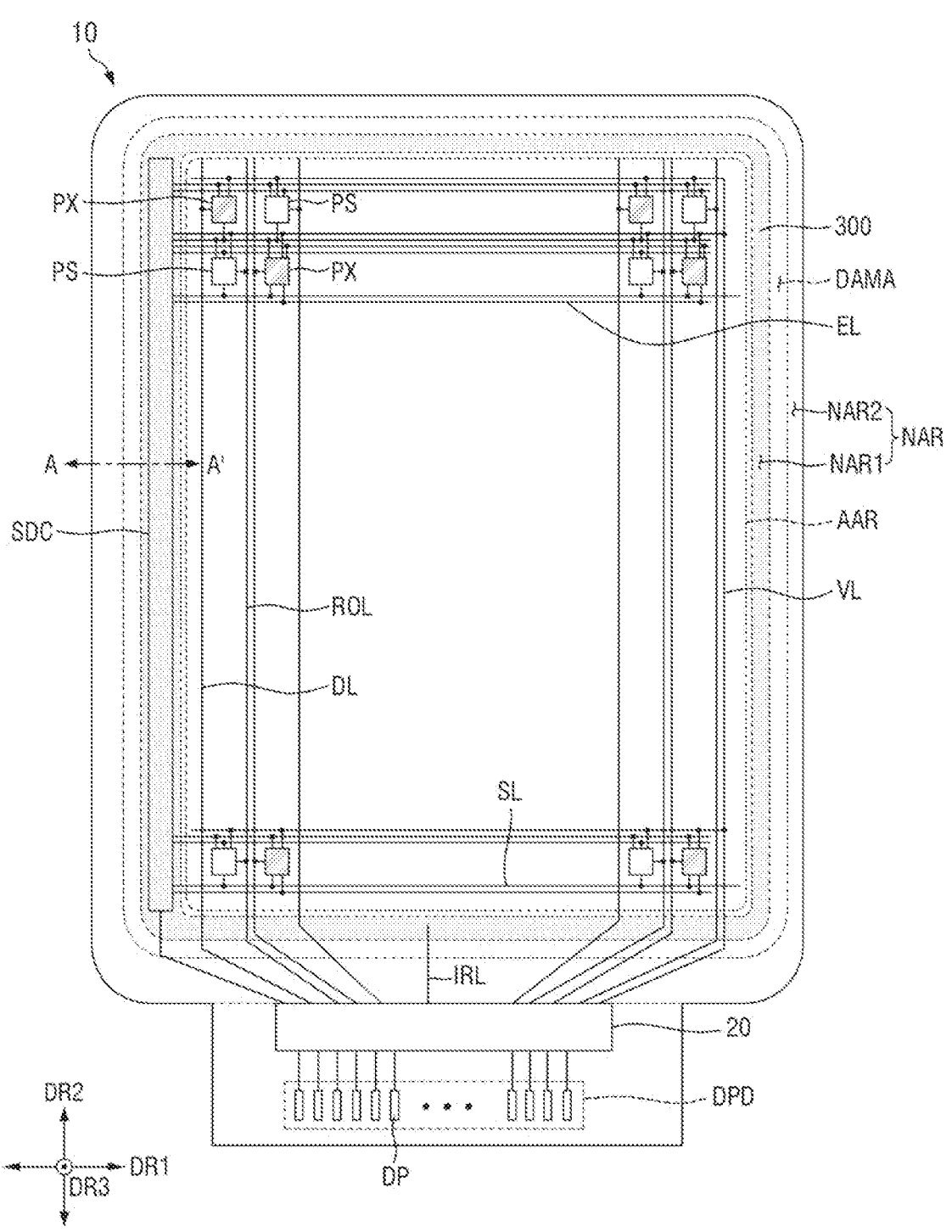
FIG. 4 is a schematic plan layout view of a display panel according to an embodiment of the present disclosure.

FIG. 4 is a schematic plan layout view of a display panel according to an embodiment of the present disclosure.

Referring to FIG. 4, the active region AAR of the display panel 10 may include scan lines SL and power voltage lines VL connected to the plurality of pixels PX and the plurality of optical sensors PS, light emitting control lines EL and data lines DL connected to the plurality of pixels PX, and readout lines ROL connected to the plurality of optical sensors PS may be disposed in the active region AAR of the display panel 10.

The scan lines SL may supply scan signals received from a scan driver SDC to the plurality of pixels PX and the plurality of optical sensors PS. The scan lines SL may extend in the first direction DR1 and may be spaced apart from each other in the second direction DR2.

The light emitting control lines EL may supply light emitting control signals received from the scan driver SDC to the plurality of pixels PX. The light emitting control lines EL may extend in the first direction DR1 and may be spaced apart from each other in the second direction DR2.

The data lines DL may supply the data voltage received from the display driving circuit 20 to the plurality of pixels PX. The data lines DL may extend in the second direction DR2 and may be spaced apart from each other in the first direction DR1.

Figure 5:
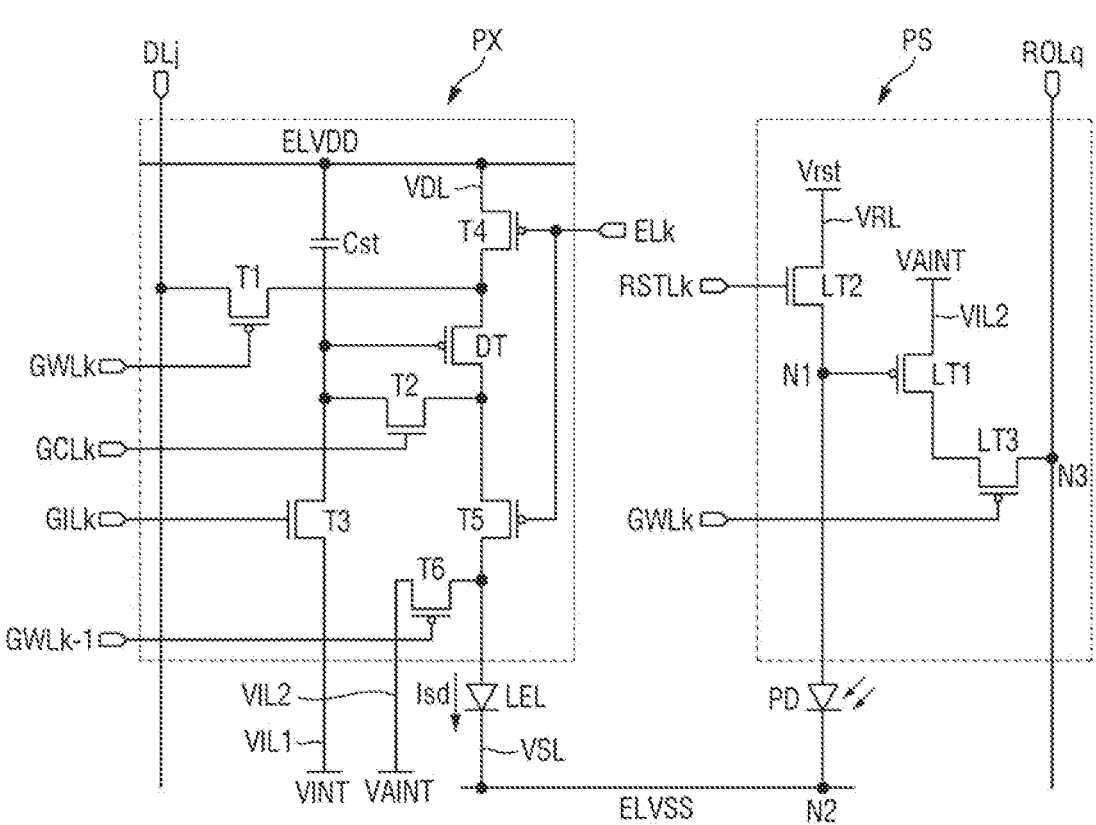
FIG. 5 is a circuit diagram of a pixel and an optical sensor of the display panel according to an embodiment of the present disclosure.

The power voltage lines VL may supply power voltages received from the display driving circuit 20 to the plurality of pixels PX and the plurality of optical sensors PS. In an embodiment, the power voltage may be at least one of a driving power voltage ELVDD, a common voltage ELVSS (FIG. 5), a first initialization voltage VINT (FIG. 5), and a second initialization voltage VAINT (FIG. 5). The driving power voltage ELVDD may be a high potential voltage for driving the light emitting element and the photoelectric conversion element, and the common voltage ELVSS may be a low potential voltage for driving the light emitting element and the photoelectric conversion element. The power voltage line VL may extend in the second direction DR2 in the active region AAR, may be spaced apart from each other in the first direction DR1, and may be connected to each other in the non-active region NAR.

The readout lines ROL may supply a sensing current generated in the optical sensor PS according to external light to the readout circuit (40 in FIG. 1). The readout lines ROL may extend in the second direction DR2 and may be spaced apart from each other in the first direction DR1.

The non-active region NAR of the display panel 10 may include a scan driver SDC, a light source unit 300, a light source voltage line IRL, and a display driving circuit 20.

In an embodiment, the scan driver SDC and the light source unit 300 may be disposed in the dam region DAMA and the first non-active region NAR1 of the non-active region NAR.

In an embodiment, the scan driver SDC may be disposed on one side (e.g., a left side in the first direction DR1) of the active region AAR. However, embodiments of the present disclosure are not necessarily limited thereto. The scan driver SDC may receive a scan control signal from the display driving circuit 20, generate a plurality of scan signals, and output the plurality of scan signals to the plurality of scan lines SL.

The light source unit 300 may overlap the scan driver SDC in the third direction DR3. For example, referring to FIG. 9, the light emitting element layer EML may include the light source unit 300, and the thin film transistor layer TFTL may include a scan transistor SCT of the scan driver SDC disposed on a lower side of the light source unit 300. The light source unit 300 may be disposed in a bezel region around the active region AAR. The light source unit 300 may surround all sides (e.g., four sides in FIG. 4) of the active region AAR. However, embodiments of the present disclosure are not necessarily limited thereto. For example, in an embodiment the light source unit 300 may be disposed on one side (e.g., a left side in the first direction DR1) of the active region AAR. In an embodiment, the light source unit 300 may surround at least three sides of the active region AAR.

The light source voltage line IRL may supply the light source voltage received from the display driving circuit 20 to the light source unit 300. As shown in an embodiment of FIG. 4, the light source voltage line IRL may extend in the second direction DR2. However, embodiments of the present disclosure are not necessarily limited thereto. The light source voltage line IRL may be connected to a first electrode (310 in FIG. 9) of the light source unit 300 to apply the light source voltage thereto.

The display driving circuit 20 may output signals and voltages for driving the display panel 10. The display driving circuit 20 may supply a data voltage to the data line DL. The data voltage may be supplied to the plurality of pixels PX and may determine luminance of the plurality of pixels PX.

In an embodiment, the non-active region NAR may include a readout circuit. The readout circuit may be connected to each of the optical sensor PS through a readout line ROL, and may generate fingerprint detection data according to the magnitude of a current sensed by each optical sensor PS and transmit the fingerprint detection data to a main processor.

The non-active region NAR of the display panel 10 may include a display pad unit DPD including a plurality of display pads DP. The display pad unit DPD may be electrically connected to the circuit board 30.

FIG. 5 is a circuit diagram of a pixel and an optical sensor of the display panel according to an embodiment.

FIG. 5 illustrates a circuit diagram of an optical sensor PS connected to a k-th scan initialization line GILk, a k-th scan write line GWLk, a k-th scan control line GCLk, a k−1-th scan write line GWLk−1, and a j-th data line DLj, and an optical sensor PS connected to the k-th scan write line GWLk, a k-th reset control line RSTLk, and a q-th readout line ROLq.

The pixel PX may include a light emitting element LEL and a pixel driver controlling the amount of light emitted from the light emitting element LEL. The pixel driver may include a driving transistor DT, a plurality of switch elements, and a first capacitor Cst. The switch elements include first to sixth transistors T1, T2, T3, T4, T5, and T6. The pixel driver may be connected to a driving voltage line VDL to which the driving voltage ELVDD is applied, a common voltage line VSL to which the common voltage ELVSS is applied, a first initialization voltage line VIL1 to which the first initialization voltage VINT is applied, and a second initialization voltage line VIL2 to which the second initialization voltage VAINT is applied.

The driving transistor DT may include a gate electrode, a first electrode, and a second electrode. The driving transistor DT controls a drain-source current Isd (hereinafter, referred to as a "driving current") flowing between the first electrode and the second electrode according to a data voltage applied to the gate electrode. The driving current Isd flowing through a channel of the driving transistor DT is proportional to a square of a difference between a voltage Vsg between the first electrode and the gate electrode of the driving transistor DT and a threshold voltage Vth of the driving transistor DT as in Equation 1.

$$Isd = k' \times (Vsg - Vth)^2 \qquad \text{[Equation 1]}$$

In Equation 1, Isd is a driving current and denotes a source-drain current flowing through the channel of the driving transistor DT, k' denotes a proportional coefficient determined by a structure and physical characteristics of the driving transistor, Vsg denotes a voltage between the first electrode and the gate electrode of the driving transistor, and Vth denotes the threshold voltage of the driving transistor.

The light emitting element LEL emits light according to the driving current Isd. As the driving current Isd increases, the amount of light emitted from the light emitting element LEL may increase.

Figure 8:
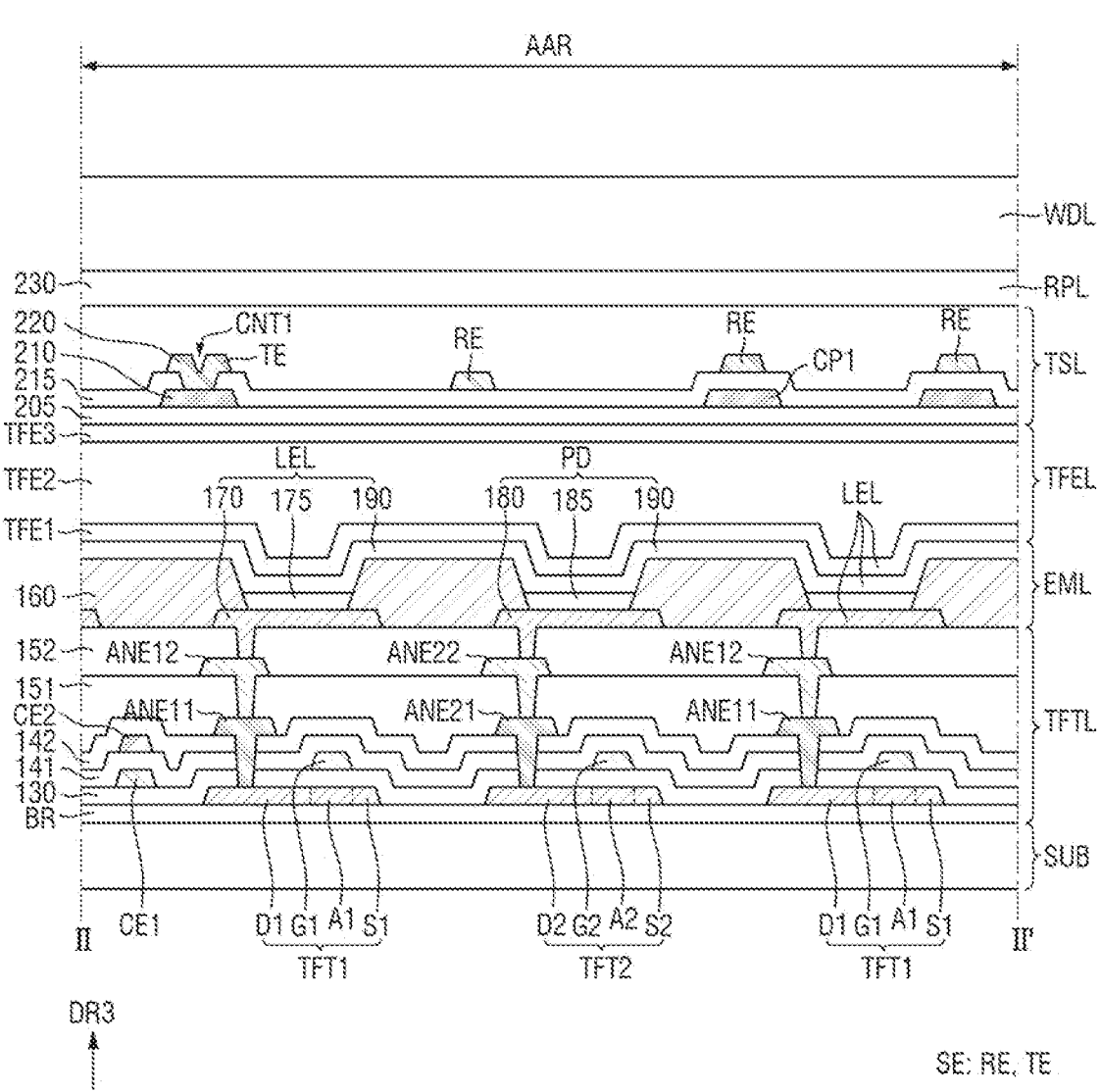
FIG. 8 is a cross-sectional view taken along line II-II' of FIG. 7 according to an embodiment of the present disclosure.

In an embodiment, the light emitting element LEL may be an organic light emitting diode including an organic light emitting layer disposed between an anode electrode and a cathode electrode. Alternatively, the light emitting element LEL may be a quantum dot light emitting element including a quantum dot light emitting layer disposed between the anode electrode and the cathode electrode. Alternatively, the light emitting element LEL may be an inorganic light emitting element including an inorganic semiconductor disposed between the anode electrode and the cathode electrode. In an embodiment in which the light emitting element LEL is the inorganic light emitting element, the light emitting element LEL may include a micro light emitting diode or a nano light emitting diode. In FIG. 8, the anode electrode of the light emitting element LEL corresponds to a pixel electrode 170, and the cathode electrode thereof corresponds to a common electrode 190.

The anode electrode of the light emitting element LEL may be connected to a second electrode of the fifth transistor T5 and a first electrode of the sixth transistor T6, and the cathode electrode thereof may be connected to the common voltage line VSL to which the common voltage ELVSS is applied.

The first transistor T1 is turned on by a k-th scan write signal of the k-th scan write line GWLk to connect the first electrode of the driving transistor to the j-th data line DLj. Accordingly, a data voltage of the j-th data line DLj may be applied to the first electrode of the driving transistor DT. A gate electrode of the first transistor T1 may be connected to the k-th scan write line GWLk, a first electrode thereof may be connected to the j-th data line DLj, and a second electrode thereof may be connected to the first electrode of the driving transistor DT.

The second transistor T2 is turned on by a k-th scan control signal of the k-th scan control line GCLk to connect the gate electrode and the second electrode of the driving transistor DT to each other. When the gate electrode and the second electrode of the driving transistor DT are connected to each other, the driving transistor DT is driven as a diode. A gate electrode of the second transistor T2 may be connected to the k-th scan control line GCLk, a first electrode thereof may be connected to the gate electrode of the driving transistor DT, and a second electrode thereof may be the second electrode of the driving transistor DT.

The third transistor T3 is turned on by a k-th scan initialization signal of the k-th scan initialization line GILk to connect the gate electrode of the driving transistor DT to the first initialization voltage line VIL1. Accordingly, the first initialization voltage VINT of the first initialization voltage line VIL1 may be applied to the gate electrode of the driving transistor DT. A gate electrode of the third transistor T3 may be connected to the k-th scan initialization line GILk, a first electrode thereof may be connected to the first initialization voltage line VIL1, and a second electrode thereof may be the gate electrode of the driving transistor DT.

The fourth transistor T4 is turned on by a k-th light emitting control signal of the k-th light emitting control line Elk to connect the first electrode of the driving transistor DT to the driving voltage line VDL to which the driving voltage ELVDD is applied. A gate electrode of the fourth transistor T4 may be connected to the k-th light emitting control line ELk, a first electrode thereof may be connected to the driving voltage line VDL, and a second electrode thereof may be connected to the first electrode of the driving transistor DT.

The fifth transistor T5 is turned on by the k-th light emitting control signal of the k-th light emitting control line ELk to connect the second electrode of the driving transistor DT to the anode electrode of the light emitting element LEL. A gate electrode of the fifth transistor T5 may be connected to the k-th light emitting control line ELk, a first electrode thereof may be connected to the second electrode of the driving transistor DT, and a second electrode thereof may be connected to the anode electrode of the light emitting element LEL.

When both the fourth transistor T4 and the fifth transistor T5 are turned on, the driving current Isd of the driving transistor DT according to the voltage of the gate electrode of the driving transistor DT may flow to the light emitting element LEL.

The sixth transistor T6 is turned on by a k−1-th scan signal of the k−1-th scan write line GWLk−1 to connect the anode electrode of the light emitting element LEL to the second initialization voltage line VIL2. The second initialization voltage VAINT of the second initialization voltage line VIL2 may be applied to the anode electrode of the light emitting element LEL. A gate electrode of the sixth transistor T6 may be connected to the k−1-th scan write line GWLk−1, a first electrode thereof may be connected to the anode electrode of the light emitting element LEL, and a second electrode thereof may be connected to the second initialization voltage line VIL2.

The first capacitor Cst is formed between the gate electrode of the driving transistor DT and the driving voltage line VDL. A first capacitor electrode of the first capacitor Cst may be connected to the gate electrode of the driving transistor DT, and a second capacitor electrode thereof may be connected to the driving voltage line VDL.

When the first electrode of each of the driving transistor DT and the first to sixth transistors T1, T2, T3, T4, T5, and T6 is a source electrode, the second electrode thereof may be a drain electrode. Alternatively, when the first electrode of each of the driving transistor DT and the first to sixth transistors T1, T2, T3, T4, T5, and T6 is a drain electrode, the second electrode thereof may be a source electrode.

In an embodiment, an active layer of each of the driving transistor DT and the first to sixth transistors T1, T2, T3, T4, T5, and T6 may be formed of any one of polysilicon, amorphous silicon, and an oxide semiconductor. For example, in an embodiment an active layer of each of the driving transistor DT, the first transistor T1, and the fourth to sixth transistors T4 to T6 may be made of polysilicon. An active layer of each of the second transistor T2 and the third transistor T3 may be made of an oxide semiconductor. In this embodiment, the driving transistor DT, the first transistor T1, and the fourth to sixth transistors T4 to T6 may be formed of a P-type MOSFET, and the second transistor T2 and the third transistor T3 may be formed of an N-type MOSFET.

Each of the plurality of optical sensors PS may include a photoelectric conversion element PD and a sensing driver controlling a sensing current according to the photocurrent of the photoelectric conversion element PD. The sensing driver may include a plurality of sensing transistors LT1, LT2, and LT3 for controlling the sensing current generated by the photoelectric conversion element PD. The sense driver may be connected to the reset voltage line VRL to which the reset voltage Vrst is applied, the second initialization voltage line VIL2 to which the second initialization voltage VAINT is applied, and the common voltage line VSL to which the common voltage ELVSS is applied.

Each of the photoelectric conversion elements PD may be a photodiode including a sensing anode electrode, a sensing cathode electrode, and a photoelectric conversion layer disposed between the sensing anode electrode and the sensing cathode electrode. Each of the photoelectric conversion elements PD may convert light incident from the outside into an electrical signal. The photoelectric conversion element PD may be an inorganic photodiode or a phototransistor formed of a pn-type or pin-type inorganic material. Alternatively, the photoelectric conversion element PD may also be an organic photodiode including an electron donating material generating donor ions and an electron accepting material generating acceptor ions. In FIG. 8, the sensing anode electrode of the photoelectric conversion element PD corresponds to a sensing electrode 180, and the sensing cathode electrode thereof corresponds to the common electrode 190.

When the photoelectric conversion element PD is exposed to external light, photocharges may be generated, and the generated photocharges may be accumulated in the sensing anode electrode of the photoelectric conversion element PD. In this case, a voltage of a first node N1 electrically connected to the sensing anode electrode may increase. When the photoelectric conversion element PD and the q-th readout line ROLq are connected to each other according to the turn-on of the first and third sensing transistors LT1 and LT3, a sensing voltage may be accumulated in a third node N3 between the q-th readout line ROLq and the third sensing transistor LT3 in proportion to the voltage of the first node N1 in which the charges are accumulated.

The first sensing transistor LT1 may be turned on by the voltage of the first node N1 applied to a gate electrode thereof to connect the second initialization voltage line VIL2 and a second electrode of the third sensing transistor LT3 to each other. The gate electrode of the first sensing transistor LT1 may be connected to the first node N1, a first electrode thereof may be connected to the second initialization voltage line VIL2, and a second electrode thereof may be connected to a first electrode of the third sensing transistor LT3. The first sensing transistor LT1 may be a source follower amplifier that generates a source-drain current in proportion to the amount of charge of the first node N1 input to the gate electrode thereof. In an embodiment of FIG. 5, the first electrode of the first sensing transistor LT1 is illustrated as being connected to the second initialization voltage line VIL2. However, embodiments of the present disclosure are not necessarily limited thereto, and the first sensing transistor LT1 may also be connected to the driving voltage line VDL or the first initialization voltage line VIL1 in some embodiments.

The second sensing transistor LT2 may be turned on by the k-th reset control signal of the k-th reset control line RSTLk to connect the first node N1 to the reset voltage line VRL to which the reset voltage Vrst is applied. A gate electrode of the second sensing transistor LT2 may be connected to the k-th reset control line RSTLk, a first electrode thereof may be connected to the reset voltage line VRL, and a second electrode thereof may be connected to the first node N1.

The third sensing transistor LT3 may be turned on by the k-th scan write signal of the k-th scan write line GWLk to connect the second electrode of the first sensing transistor LT1 and the q-th readout line ROLq to each other. A gate electrode of the third sensing transistor LT3 may be connected to the k-th scan write line GWLk, the first electrode thereof may be connected to the second electrode of the first sensing transistor LT1, and the second electrode thereof may be connected to the third node N3 and the q-th readout line ROLq.

In an embodiment, an active layer of each of the first to third sensing transistors LT1, LT2, and LT3 may also be formed of any one of polysilicon, amorphous silicon, and oxide semiconductor. For example, in an embodiment the active layers of the first sensing transistor LT1 and the third sensing transistor LT3 may be made of polysilicon. The active layer of the second sensing transistor LT2 may be made of an oxide semiconductor. In this embodiment, the first sensing transistor LT1 and the third sensing transistor LT3 may be formed of a P-type MOSFET, and the second sensing transistor LT2 may be formed of an N-type MOS-FET.

Figure 6:
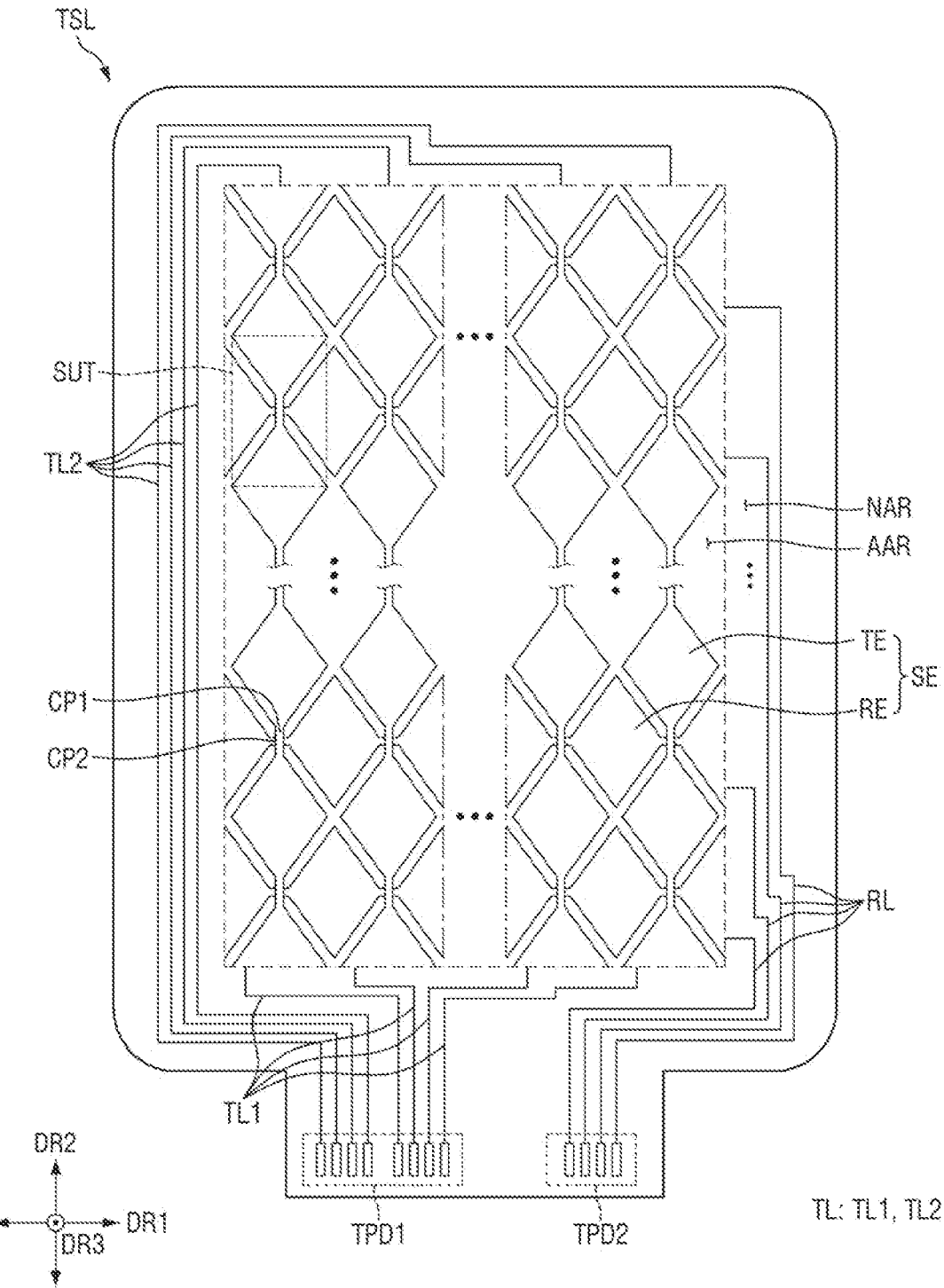
FIG. 6 is a schematic plan layout view of a touch sensing layer of the display panel according to an embodiment of the present disclosure.

FIG. 6 is a schematic plan layout view of a touch sensing layer of the display panel according to an embodiment of the present disclosure.

Referring to FIG. 6, a touch sensing layer TSL includes a touch sensing region for sensing a user's touch and a touch peripheral region disposed around the touch sensing region (e.g., in the first and/or second directions DR1, DR2). The touch sensing region may correspond to the above-described active region AAR, and the touch peripheral region may correspond to the above-described non-active region NAR.

The active region AAR may include a plurality of touch electrodes SE. In an embodiment, the plurality of touch electrodes SE includes two types of electrodes, for example, driving electrodes TE and sensing electrodes RE. In an embodiment, after applying a touch driving signal to the driving electrodes TE, a charge change amount of a mutual capacitance of a unit sensing region SUT may be sensed through the sensing electrodes RE. However, embodiments of the present disclosure are not necessarily limited thereto.

The touch sensing layer TSL may include a plurality of driving electrodes TE, a plurality of sensing electrodes RE, a plurality of driving lines TL, and a plurality of sensing lines RL.

The plurality of driving electrodes TE may be electrically connected to each other in the second direction DR2 and may be spaced apart from each other in the first direction DR1. The driving electrodes TE adjacent to each other in the second direction DR2 may be connected to each other through a first connection portion CP1.

The plurality of sensing electrodes RE may be electrically connected to each other in the first direction DR1 and may be spaced apart from each other in the second direction DR2. The sensing electrodes RE adjacent to each other in the first direction DR1 may be connected to each other through a second connection portion CP2.

In the touch sensing layer TSL according to an embodiment of the present disclosure, since the plurality of driving electrodes TE, the second connection portion CP2, and the plurality of sensing electrodes RE are disposed on a different touch conductive layer from the first connection portion CP1, the plurality of driving electrodes TE, the second connection portion CP2, and the plurality of sensing electrodes RE may be electrically insulated in intersection regions.

The plurality of signal lines may be disposed in the non-active region NAR. The plurality of signal lines may include a plurality of driving lines TL connected to the plurality of driving electrodes TE, respectively, and a plurality of sensing lines RL connected to the plurality of sensing electrodes RE, respectively.

In an embodiment, the plurality of driving lines TL may include a first driving line TL1 connected to the driving electrode TE disposed at an end on one side among the driving electrodes TE electrically connected in the second direction DR2, and a second driving line TL2 connected to the driving electrode TE disposed at an end on the other side. For example, the first driving line TL1 may be connected to the driving electrode TE in the lower side of the active region AAR (e.g., in the second direction DR2), and the second driving line TL2 may be connected to the driving electrode TE in the upper side of the active region AAR (e.g., in the second direction DR2). The first driving line TL1 and the second driving line TL2 may be connected to the touch driving circuit through a first touch pad portion TPD1.

The plurality of sensing lines RL may be connected to the sensing electrode RE disposed at an end on one side among the sensing electrodes RE electrically connected in the first direction DR1. For example, in an embodiment, the sensing lines RL may be connected to the sensing electrode RE disposed at a right side in the first direction DR1. However, embodiments of the present disclosure are not necessarily limited thereto. The sensing lines RL may be connected to the touch driving circuit through a second touch pad portion TPD2.

Figure 7:
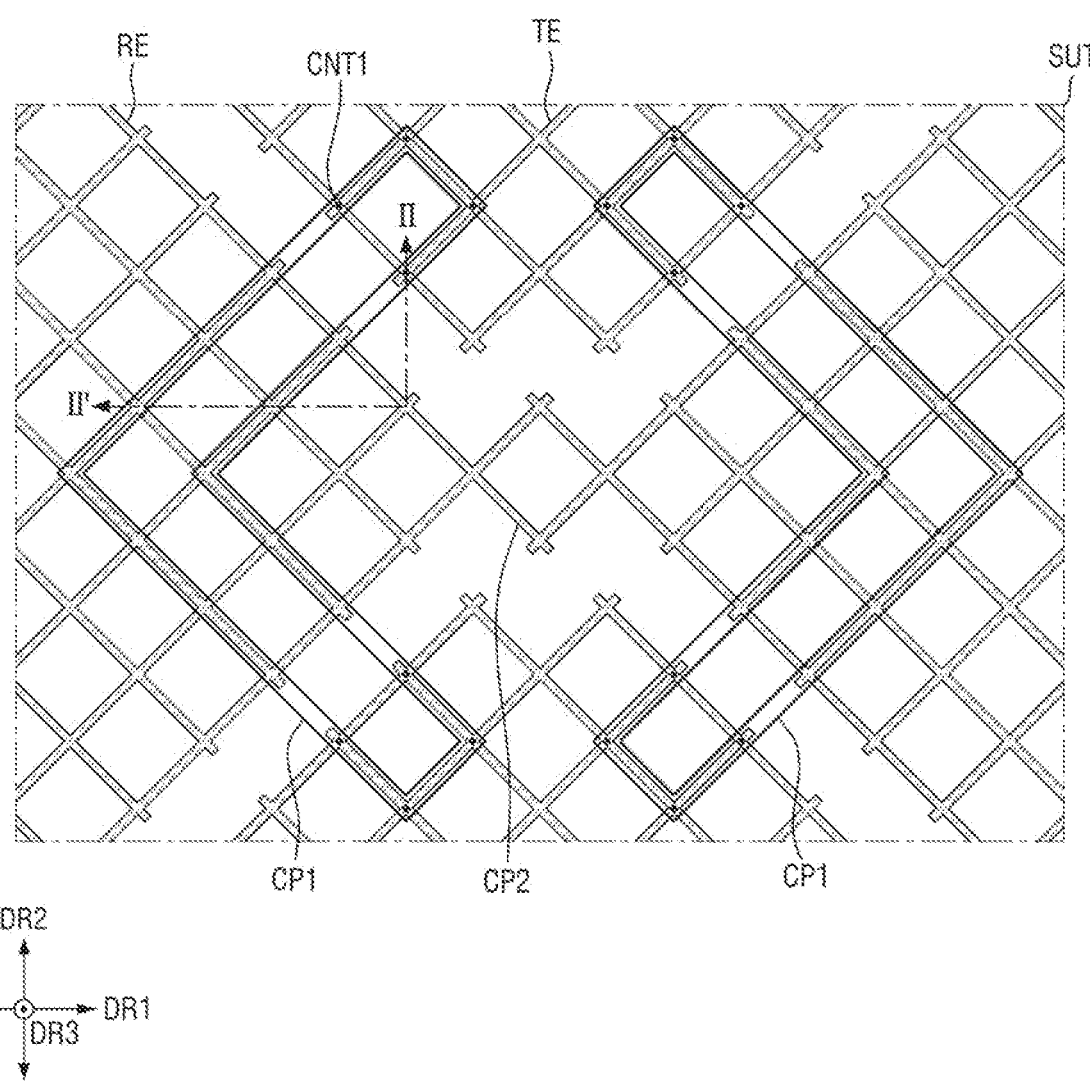
FIG. 7 is an enlarged plan view of a touch electrode of the touch sensing layer according to an embodiment of the present disclosure.

FIG. 7 is an enlarged plan view of a touch electrode of the touch sensing layer according to an embodiment.

Referring to FIG. 7, the sensing electrodes RE and the driving electrodes TE may be electrically separated at intersection portions thereof and the driving electrodes TE adjacent to each other in the second direction DR2 may be connected to each other through the first connection portions CP1, and the sensing electrodes RE adjacent to each other in the first direction DR1 may be connected to each other through the second connection portions CP2. For insulation intersection, the first connection portions CP1 may be formed on a layer different from that of the sensing electrodes RE and the driving electrodes TE, and may be connected to the driving electrodes TE through first contact holes CNT1.

The driving electrodes TE, the sensing electrodes RE, the first connection portions CP1, and the second connection portion CP2 may be formed in a mesh pattern in a plan view. However, the driving electrodes TE, the sensing electrodes RE, the first connection portions CP1, and the second connection portion CP2 are not necessarily limited thereto, and may be formed in a planar pattern made of a transparent conductive layer, etc. The light emitting regions of the pixel and the light sensing regions of the optical sensor may be disposed in a mesh hole exposed by each mesh pattern.

FIG. 8 is a cross-sectional view taken along line II-II' of FIG. 7 according to an embodiment of the present disclosure.

Referring to FIG. 8, a barrier layer BR may be disposed on the substrate SUB (e.g., disposed directly thereon). In an embodiment, the barrier layer BR may include silicon nitride, silicon oxide, or silicon oxynitride.

In an embodiment, the thin film transistor layer TFTL disposed on the barrier layer BR may include a first thin film transistor TFT1 and a second thin film transistor TFT2. In an embodiment, the first thin film transistor TFT1 may be one of the driving transistor DT or the first to sixth transistors T1 to T6 illustrated in FIG. 5. The second thin film transistor TFT2 may be one of the first to third sensing transistors LT1 to LT3 illustrated in FIG. 5.

First active layers of the plurality of thin film transistors TFT1 and TFT2 may be disposed on the barrier layer BR (e.g., disposed directly thereon). In an embodiment, the first active layer of the first thin film transistor TFT1 may include polycrystalline silicon, single crystal silicon, low-temperature polycrystalline silicon, amorphous silicon, or an oxide semiconductor. The oxide semiconductor may include a binary compound (ABx), a ternary compound (ABxCy), and a quaternary compound (ABxCyDz) containing, for example, indium, zinc, gallium, tin, titanium, aluminum, hafnium (Hf), zirconium (Zr), magnesium (Mg), and the like.

The first active layer may include channel regions A1 and A2 and source regions S1 and S2 and drain regions D1 and D2 doped with impurities to have conductivity, respectively. The channel regions A1 and A2 may be regions overlapping gate electrodes G1 and G2 in the third direction DR3 that is the thickness direction of the substrate SUB. The source regions S1 and S2 and the drain regions D1 and D2 may be regions that do not overlap the gate electrodes G1 and G2.

A first gate insulating layer 130 may be disposed on the first active layer (e.g., disposed directly thereon). In an embodiment, the first gate insulating layer 130 may be formed of an inorganic layer, for example, a silicon nitride layer, a silicon oxynitride layer, a silicon oxide layer, a titanium oxide layer, or an aluminum oxide layer.

A first gate electrode G1 and a first capacitor electrode CE1 of the first thin film transistor TFT1 may be disposed on the first gate insulating layer 130 (e.g., disposed directly thereon). In an embodiment, the first gate electrode G1 and the first capacitor electrode CE1 are spaced apart from each other. However, embodiments of the present disclosure are not necessarily limited thereto and the first gate electrode G1 and the first capacitor electrode CE1 may be connected to each other. A second gate electrode G2 of the second thin film transistor TFT2 may be disposed on the first gate insulating layer 130 (e.g., disposed directly thereon). In an embodiment, the first gate electrode G1, the first capacitor electrode CE1, and the second gate electrode G2 may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating layer 141 may be disposed on the first gate electrode G1 and the first capacitor electrode CE1 of the first thin film transistor TFT1, and the second gate electrode G2 of the second thin film transistor TFT2 (e.g., disposed directly thereon). In an embodiment, the first interlayer insulating layer 141 may be formed of an inorganic layer, for example, a silicon nitride layer, a silicon oxynitride layer, a silicon oxide layer, a titanium oxide layer, or an aluminum oxide layer.

The second capacitor electrode CE2 may be disposed on the first interlayer insulating layer 141. The second capacitor electrode CE2 may overlap the first capacitor electrode CE1 of the first thin film transistor TFT1 in the third direction DR3. A first capacitor may be formed between the first capacitor electrode CE1 and the second capacitor electrode CE2. In an embodiment, the second capacitor electrode CE2 may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating layer 142 may be disposed on the second capacitor electrode CE2 (e.g., disposed directly thereon). In an embodiment, the second interlayer insulating layer 142 may include the same material as the first interlayer insulating layer 141 described above.

First anode connection electrodes ANE11 and ANE21 may be disposed on the second interlayer insulating layer 142 (e.g., disposed directly thereon). The first anode connection electrodes ANE11 and ANE21 may be connected to the drain regions D1 and D2 of the thin film transistors TFT1 and TFT2 through contact holes penetrating the first gate insulating layer 130, the first interlayer insulating layer 141, and the second interlayer insulating layer 142, respectively. In an embodiment, the first anode connection electrodes ANE11 and ANE21 may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization layer 151 for planarizing steps caused by the thin film transistors TFT1 and TFT2 may be disposed on the first anode connection electrodes ANE11 and ANE21 (e.g., disposed directly thereon). In an embodiment, the first planarization layer 151 may be formed of an organic layer made of an acryl resin, an epoxy resin, a phenolic resin, a polyamide resin, a polyimide resin, or the like.

Second anode connection electrodes ANE12 and ANE22 may be disposed on the first planarization layer 151. The second anode connection electrodes ANE12 and ANE22 may be connected to the first anode connection electrodes ANE11 and ANE21 through contact holes penetrating through the first planarization layer 151. In an embodiment, the second anode connection electrodes ANE12 and ANE22 may include the same material as the first anode connection electrodes ANE11 and ANE21 described above.

A second planarization layer 152 may be disposed on the second anode connection electrodes ANE12 and ANE22 (e.g., disposed directly thereon). In an embodiment, the second planarization layer 152 may include the same material as the first planarization layer 151 described above.

A light emitting element layer EML may be disposed on the second planarization layer 152 (e.g., disposed directly thereon). The light emitting element layer EML may include a light emitting element LEL, a photoelectric conversion element PD, and a pixel defining layer 160. The light emitting element LEL may include a pixel electrode 170, a first light emitting layer 175, and a common electrode 190, and the photoelectric conversion element PD may include a sensing electrode 180, a photoelectric conversion layer 185, and a common electrode 190. In an embodiment, the light emitting elements LEL and the photoelectric conversion elements PD may share the common electrode 190.

The pixel electrode 170 of the light emitting element LEL may be disposed on the second planarization layer 152 (e.g., disposed directly thereon). In an embodiment, the pixel electrode 170 may be provided for each pixel PX. The pixel electrode 170 may be connected to the second anode connection electrode ANE12 through a contact hole penetrating through the second planarization layer 152.

In an embodiment, the pixel electrode 170 of the light emitting element LEL is not necessarily limited to, but may have a single layer structure of molybdenum (Mo), titanium (Ti), copper (Cu), or aluminum (Al), or may have a stacked layer structure, for example, a multilayer structure of Indium-Tin-Oxide (ITO), Indium-Zinc-Oxide (IZO), Zinc Oxide (ZnO), Indium Oxide ($In_2O_3$), and ITO/Mg, ITO/MgF, ITO/Ag, and ITO/Ag/ITO containing silver (Ag), magnesium (Mg), aluminum (Al), platinum (Pt), lead (Pb), gold (Au), and nickel (Ni).

In addition, the sensing electrode 180 of the photoelectric conversion element PD may be disposed on the second planarization layer 152 (e.g., disposed directly thereon). In an embodiment, the sensing electrode 180 may be provided for each optical sensor PS. The sensing electrode 180 may be connected to the second anode connection electrode ANE22 through a contact hole penetrating through the second planarization layer 152.

In an embodiment, the sensing electrode 180 of the photoelectric conversion element PD is not necessarily limited to, but may have a single layer structure of molybdenum (Mo), titanium (Ti), copper (Cu), or aluminum (Al), or may have a multilayer structure of ITO/Mg, ITO/MgF, ITO/Ag, and ITO/Ag/ITO.

The pixel defining layer 160 may be disposed on the pixel electrode 170 and the sensing electrode 180 (e.g., disposed directly thereon). The pixel defining layer 160 may form an opening that is formed in a region overlapping the pixel electrode 170 and exposes the pixel electrode 170. A region in which the exposed pixel electrode 170 and the first light emitting layer 175 overlap may be defined as a light emitting region of each pixel PX.

In addition, the pixel defining layer 160 may form an opening that is formed in a region overlapping the sensing electrode 180 and exposes the sensing electrode 180. The opening exposing the sensing electrode 180 may provide a space in which the photoelectric conversion layer 185 of each optical sensor PS is formed, and a region in which the exposed sensing electrode 180 and the photoelectric conversion layer 185 overlap may be defined as a light sensing region.

In an embodiment, the pixel defining layer 160 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). However, embodiments of the present disclosure are not necessarily limited thereto. For example, in an embodiment the pixel defining layer 160 may also include an inorganic material such as silicon nitride.

A first light emitting layer 175 may be disposed on the pixel electrode 170 of the light emitting element LEL exposed by the opening of the pixel defining layer 160. In an embodiment, the first light emitting layer 175 may include a high molecular material or a low molecular material, and may emit visible light of red, green, or blue light for each pixel PX. However, embodiments of the present disclosure are not necessarily limited thereto and the color of the light emitted by the pixel PX may vary. The visible light may correspond to a wavelength band in a range of about 380 nm to about 780 nm. The light emitted from the first light emitting layer 175 may contribute to displaying an image.

In an embodiment in which the first light emitting layer 175 is formed of an organic material, a hole injecting layer HIL and a hole transporting layer HTL may be disposed on a lower side of each first light emitting layer 175 as a center, and an electron injecting layer EIL and an electron transporting layer ETL may be stacked on an upper side of each first light emitting layer 175 as a center. These layers may be a single layer or multiple layers made of the organic material.

A photoelectric conversion layer 185 may be disposed on the sensing electrode 180 of the photoelectric conversion element PD exposed by the opening of the pixel defining layer 160. The photoelectric conversion layer 185 may generate photocharges in proportion to an amount of incident light. The incident light may be light emitted from the light source unit 300 of FIG. 9 and then reflected and entered the active region AAR to be incident on the optical sensor PS. The charges generated and accumulated in the photoelectric conversion layer 185 may be converted into electrical signals required for sensing.

The photoelectric conversion layer 185 may include an electron donating material and an electron accepting material. The electron donating material may generate donor ions in response to light, and the electron accepting material may generate acceptor ions in response to light. The photoelectric conversion layer 185 may be formed of an organic material and may include a compound sensitive to infrared light. Infrared light may correspond to a wavelength of about 780 nm to about 1000 nm.

Alternatively, in an embodiment in which the photoelectric conversion layer 185 is formed of an inorganic material, the photoelectric conversion element PD may be a pn-type or pin-type phototransistor. For example, the photoelectric conversion layer 185 may have a structure in which an N-type semiconductor layer, an I-type semiconductor layer, and a P-type semiconductor layer are sequentially stacked.

In an embodiment in which the photoelectric conversion layer 185 is formed of the organic material, a hole injecting layer HIL and a hole transporting layer HTL may be disposed on a lower side of each photoelectric conversion layer 185 as a center, and an electron injecting layer EIL and an electron transporting layer ETL may be stacked on an upper side of each photoelectric conversion layer 185 as a center. These layers may be a single layer or multiple layers made of the organic material.

The common electrode 190 may be disposed on the first light emitting layer 175, the photoelectric conversion layer 185, and the pixel defining layer 160. In an embodiment, the common electrode 190 may be disposed across all of the plurality of pixels PX and the plurality of optical sensors PS in a form covering the first light emitting layer 175, the photoelectric conversion layer 185, and the pixel defining layer 160. In an embodiment, the common electrode 190 may include a conductive material having a low work function, for example, Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg, etc.). Alternatively, the common electrode 190 may include a transparent metal oxide, for example, indium-tin-oxide (ITO), indium-zinc-oxide (IZO), or zinc oxide (ZnO). However, embodiments of the present disclosure are not necessarily limited thereto.

The encapsulation layer TFEL may be disposed on an upper side of the light emitting element layer EML and may cover the plurality of pixels PX, the plurality of optical sensors PS and the light source unit 300. In an embodiment, the encapsulation layer TFEL may include at least one inorganic layer to prevent oxygen or moisture from permeating into the light emitting element layer EML. In addition, the encapsulation layer TFEL may include at least one organic layer to protect the light emitting element layer EML from foreign materials and contaminants, such as dust. For example, in an embodiment the encapsulation layer TFEL includes a first encapsulation inorganic layer TFE1, an encapsulation organic layer TFE2, and a second encapsulation inorganic layer TFE3. However, embodiments of the present disclosure are not necessarily limited thereto and the numbers of the encapsulation inorganic layer and encapsulation organic layer may vary.

The first encapsulation inorganic layer TFE1 may be disposed on (e.g., directly thereon) the common electrode 190, the encapsulation organic layer TFE2 may be disposed on (e.g., directly thereon) the first encapsulation inorganic layer TFE1, and the second encapsulation inorganic layer TFE3 may be disposed on (e.g., directly thereon) the encapsulation organic layer TFE2. In an embodiment, the first encapsulation inorganic layer TFE1 and the second encapsulation inorganic layer TFE3 may be formed of multiple layers in which one or more inorganic layers of a silicon nitride layer, a silicon oxynitride layer, a silicon oxide layer, a titanium oxide layer, and an aluminum oxide layer are alternately stacked. The encapsulation organic layer TFE2 may be an organic layer such as an acrylic resin, an epoxy resin, a phenolic resin, a polyamide resin, or a polyimide resin. However, embodiments of the present disclosure are not necessarily limited thereto.

A base layer 205, a first touch insulating layer 215, a second touch conductive layer 220, and a second touch insulating layer 230 of the touch sensing layer TSL are sequentially disposed on the encapsulation layer TFEL.

The first touch conductive layer 210 is disposed on the base layer 205 (e.g., disposed directly thereon). The first touch conductive layer 210 is covered by the first touch insulating layer 215. The first touch insulating layer 215 insulates the first touch conductive layer 210 and the second touch conductive layer 220 from each other. The second touch conductive layer 220 is disposed on the first touch insulating layer 215 (e.g., disposed directly thereon). The second touch insulating layer 230 may cover and protect the second touch conductive layer 220.

In an embodiment, the base layer 205 may include an inorganic insulating material. For example, the base layer 205 may include a silicon nitride layer, a silicon oxynitride layer, a silicon oxide layer, a titanium oxide layer, or an aluminum oxide layer. In an embodiment, the base layer 205 may be an inorganic layer constituting the encapsulation layer TFEL, such as the second encapsulation inorganic layer TFE3.

Referring to FIG. 7 together with FIG. 8, the first connection portion CP1 may be composed of the first touch conductive layer 210, and the driving electrode TE, the sensing electrode RE, and the second connection portion CP2 may be made of the second touch conductive layer 220 positioned with the first touch insulating layer 215 interposed between the first touch conductive layer 210 and the second touch conductive layer 220. Through such a structure, mutual insulation may be secured at a portion where the driving electrode TE and the sensing electrode RE intersect. However, embodiments of the present disclosure are not necessarily limited thereto. For example, in an embodiment, the second connection portion CP2 may be made of the first touch conductive layer 210, and the driving electrode TE, the sensing electrode RE, and the first connection portion CP1 may be formed of the second touch conductive layer 220.

In an embodiment in which the driving electrodes TE, the sensing electrodes RE, the first connection portions CP1, and the second connection portions CP2 have a mesh structure, the first touch conductive layer 210 and the second touch conductive layer 220 may be made of a low-resistance material such as aluminum (Al), molybdenum (Mo), gold (Au), titanium (Ti), nickel (Ni), or copper (Cu).

The first touch insulating layer 215 and the second touch insulating layer 230 may include an inorganic insulating material or an organic insulating material. In an embodiment, one of the first touch insulating layer 215 and the second touch insulating layer 230 may include an inorganic material, and the other may include an organic material.

The first touch insulating layer 215 may include a first contact hole CNT1. The first touch conductive layer 210 (e.g., the first connection portion CP1) and a portion (e.g., the driving electrode TE) of the second touch conductive layer 220 may be electrically connected through the first contact hole CNT1.

An anti-reflection layer RPL and a window WDL may be further disposed on an upper side of the touch sensing layer TSL.

Figure 9:
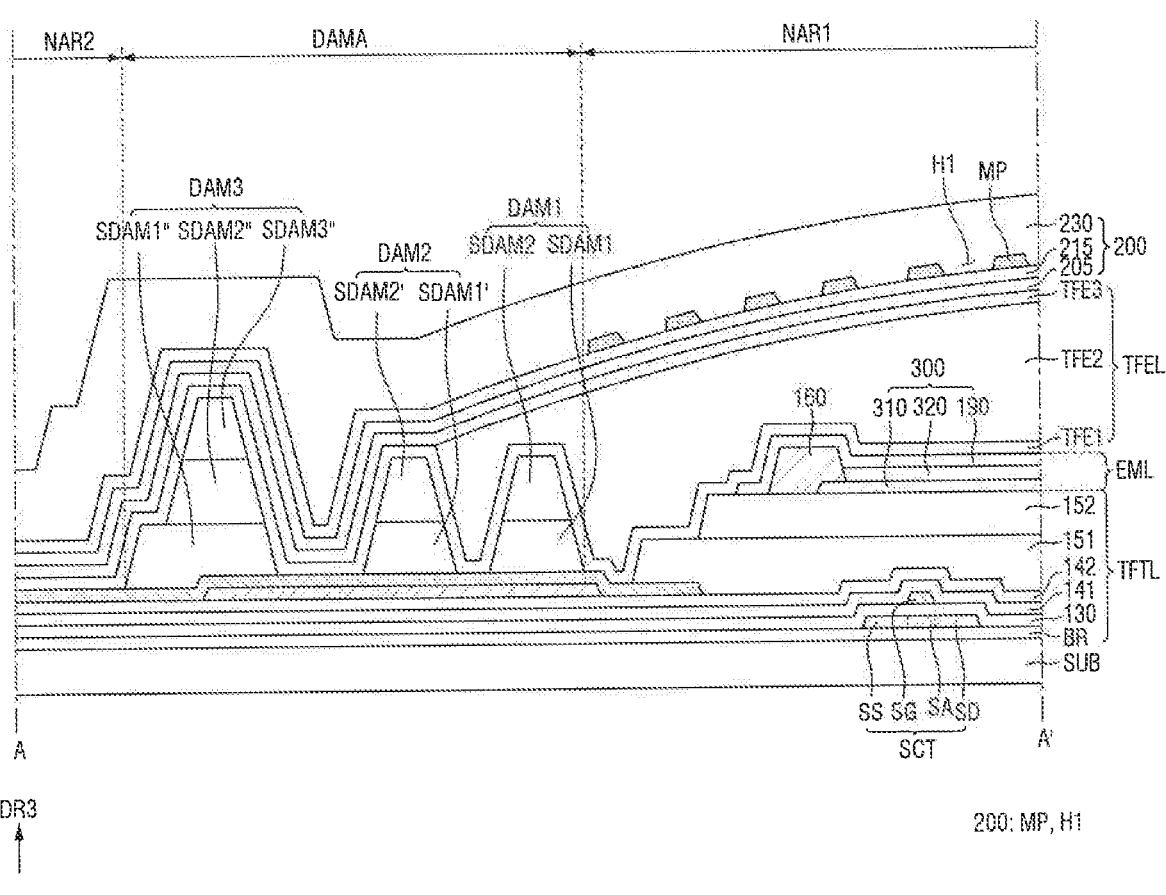
FIG. 9 is a cross-sectional view taken along line A-A' of FIG. 4 according to an embodiment of the present disclosure.

FIG. 9 is a cross-sectional view taken along line A-A' of FIG. 4 according to an embodiment of the present disclosure.

The first non-active region NAR1, the dam region DAMA, and the second non-active region NAR2 will be described with reference to FIG. 9.

The first non-active region NAR1 includes the scan transistor SCT of the scan driver, the light source unit 300, the pixel defining layer 160, and the first scattering pattern layer 200.

Each of the scan transistors SCT may include a scan channel region SA, a scan source region SS, and a scan drain region SD disposed on the first active layer. The first active layer may be disposed on the barrier layer BR. The first active layer may be covered by the first gate insulating layer 130. A gate electrode SG of the scan transistor SCT may be disposed on the first gate insulating layer 130 and may be covered by the first interlayer insulating layer 141.

The light source unit 300 and the pixel defining layer 160 may be disposed on the scan transistor SCT. The light source unit 300 may overlap the scan transistor SCT in the third direction DR3. The light source unit 300 may include a first electrode 310, a second light emitting layer 320, and a common electrode 190. The light source unit 300 may share the common electrode 190 with the light emitting elements LEL and the photoelectric conversion elements PD.

The first electrode 310 of the light source unit 300 may be disposed on the second planarization layer 152 (e.g., disposed directly thereon). In an embodiment, the first electrode 310 may be entirely disposed in the first non-active region NAR1 surrounding the active region. The first electrode 310 may be connected to a light source voltage line ("IRL" in FIG. 4).

In an embodiment, the first electrode 310 of the light source unit 300 is not necessarily limited to, but may have a single layer structure of molybdenum (Mo), titanium (Ti), copper (Cu), or aluminum (Al), or may have a stacked layer structure, for example, a multilayer structure of Indium-Tin-Oxide (ITO), Indium-Zinc-Oxide (IZO), Zinc Oxide (ZnO), Indium Oxide ($In_2O_3$), and ITO/Mg, ITO/MgF, ITO/Ag, and ITO/Ag/ITO containing silver (Ag), magnesium (Mg), aluminum (Al), platinum (Pt), lead (Pb), gold (Au), and nickel (Ni).

The pixel defining layer 160 may be disposed on the first electrode 310 (e.g., disposed directly thereon). The pixel defining layer 160 may form an opening exposing the first electrode 310. Light from the light source unit 300 may be emitted from a region in which the exposed first electrode 310 and the second light emitting layer 320 overlap (e.g., in the third direction DR3).

The second light emitting layer 320 may be disposed on the first electrode 310 of the light source unit 300 exposed by the opening of the pixel defining layer 160. The second light emitting layer 320 may include a material different from that of the first light emitting layer 175, and thus may emit infrared light in a wavelength band in a range of about 780 nm to 1000 nm. The light emitted from the second light emitting layer 320 may function as a light source of the photoelectric conversion element PD.

In an embodiment in which the second light emitting layer 320 is formed of an organic material, a hole injecting layer HIL and a hole transporting layer HTL may be disposed on a lower side of each second light emitting layer 320 as a center, and an electron injecting layer EIL and an electron transporting layer ETL may be stacked on an upper side of each second light emitting layer 320 as a center. These layers may be a single layer or multiple layers made of the organic material.

The common electrode 190 may be disposed on the first electrode 310, the second light emitting layer 320, and the pixel defining layer 160. The common electrode 190 may be disposed in the first non-active region NAR1.

In an embodiment, since the light source unit 300 emits light in a wavelength band that is higher than that of the light emitting element LEL, a stacking thickness of the light source unit 300 may be thicker than the stacking thickness of the light emitting element LEL. For example, a thickness (e.g., length in the third direction DR3) of the second light emitting layer 320 may be greater than that of the first light emitting layer 175. As another example, a thickness of the common electrode 190 disposed on the light source unit 300 may be greater than that of the common electrode 190 disposed on the light emitting element LEL. As still another example, a thickness of the organic layer disposed on the top surface or the bottom surface of the second light emitting layer 320 of the light source unit 300 may be greater than that of the organic layer disposed on the top surface or the bottom surface of the first light emitting layer 175 of the light emitting element LEL.

An encapsulation layer TFEL and a first scattering pattern layer 200 may be sequentially disposed on an upper side of the light source unit 300. The first scattering pattern layer 200 may be formed of the same layer as the touch sensing layer TSL of FIG. 8. In an embodiment, the first scattering pattern layer 200 may include the same layers as the base layer 205, the first touch conductive layer, the first touch insulating layer 215, the second touch conductive layer, and the second touch insulating layer 230. The first scattering pattern layer 200 may include metal patterns MP formed of the same material and the same process as that of the touch electrode SE. The metal patterns MP may be formed of, for example, the second touch conductive layer 220. The light emitted from the light source unit 300 may be scattered by the metal patterns MP disposed between the first holes H1 and may be incident on the optical sensor PS. Accordingly, the optical sensor PS may generate an electrical signal. In an embodiment, the optical sensors PS are configured to detect light in an infrared wavelength band.

The dam region DMA may be a region in which at least one dam is disposed. As shown in an embodiment of FIG. 9, a first dam DAM1, a second dam DAM2, and a third dam DAM3 may be disposed in the dam region DMA. However, embodiments of the present disclosure are not necessarily limited thereto and the number of dams disposed in the dam region DMA may vary.

The first dam DAM1, the second dam DAM2, and the third dam DAM3 may be disposed to be spaced apart from each other. The first dam DAM1 may be disposed closest to the first non-active region NAR1, and the third dam DAM3 may be disposed farthest from the first non-active region NAR1. The second dam DAM2 may be disposed between the first dam DAM1 and the third dam DAM3.

In an embodiment, each of the first dam DAM1 and the second dam DAM2 may include first sub-dams SDAM1/SDAM1' and second sub-dams SDAM2/SDAM2' disposed on the first sub-dams SDAM1/SDAM1'. The first sub-dams SDAM1/SDAM1' may include the same material as the pixel defining layer 160. A thickness of the first sub-dams SDAM1/SDAM1' and a thickness of the pixel defining layer 160 may be substantially the same as each other.

The third dam DAM3 may include a first sub-dam SDAM1", a second sub-dam SDAM2" disposed on the first sub-dam SDAM1", and a third sub-dam SDAM3" disposed on the second sub-dam SDAM2". A thickness of the third dam DAM3 may be greater than that of the first dam DAM1 and that of the second dam DAM2.

The second non-active region NAR2 may be disposed outside the dam region DAMA. In an embodiment, the second non-active region NAR2 may be an inorganic encapsulation region in which only an inorganic layer is disposed and an organic layer is not disposed. For example, the barrier layer BR, the first gate insulating layer 130, the first interlayer insulating layer 141, the second interlayer insulating layer 142, the first encapsulation inorganic layer TFE1, and the second encapsulation inorganic layer TFE3 may be disposed in the second non-active region NAR2d. It is possible to prevent oxygen or moisture from permeating into the light emitting elements LEL due to the inorganic encapsulation of the second non-active region NAR2.

Since the display device 1_1 according to an embodiment includes the pixels PX and the optical sensors PS disposed in the active region AAR, it is possible to display an image and recognize user's biometric information. In an embodiment in which the optical sensor PS detects light in the ultraviolet wavelength band, the display device 1_1 may include a light source unit 300 emitting light in the ultraviolet wavelength band. Since the light source unit 300 is disposed in the first non-active region NAR1 surrounding the active region AAR, the number of pixels PX and optical sensors PS per unit area that may be disposed in the active region AAR may increase. For example, a reduction in the number of pixels and optical sensors per unit area that occurs as the light source unit is disposed in the active region may be prevented, and it is possible to prevent a resolution of displaying an image and the degree of fingerprint detection from being deteriorated.

In addition, since the light source unit 300 may be formed together with the process of forming the pixel PX and the optical sensor PS, a process of separately attaching a light source member to the display device 1_1 may be omitted. Accordingly, this may reduce process costs and increase miniaturization of the display device.

In addition, light emitted from the light source unit 300 may be scattered by the first scattering pattern layer 200 disposed to overlap the light source unit 300 in a thickness direction of the substrate SUB (e.g., in the third direction DR3). For example, it is possible to minimize transmission of the light emitted from the light source unit 300 through the window WDL. Since the scattered light is totally reflected by the metal pattern MP of the first scattering pattern layer 200 and contributes to the formation of an electrical signal of the optical sensor PS, a fingerprint detection accuracy of the display device 1_1 may increase.

Figure 10:
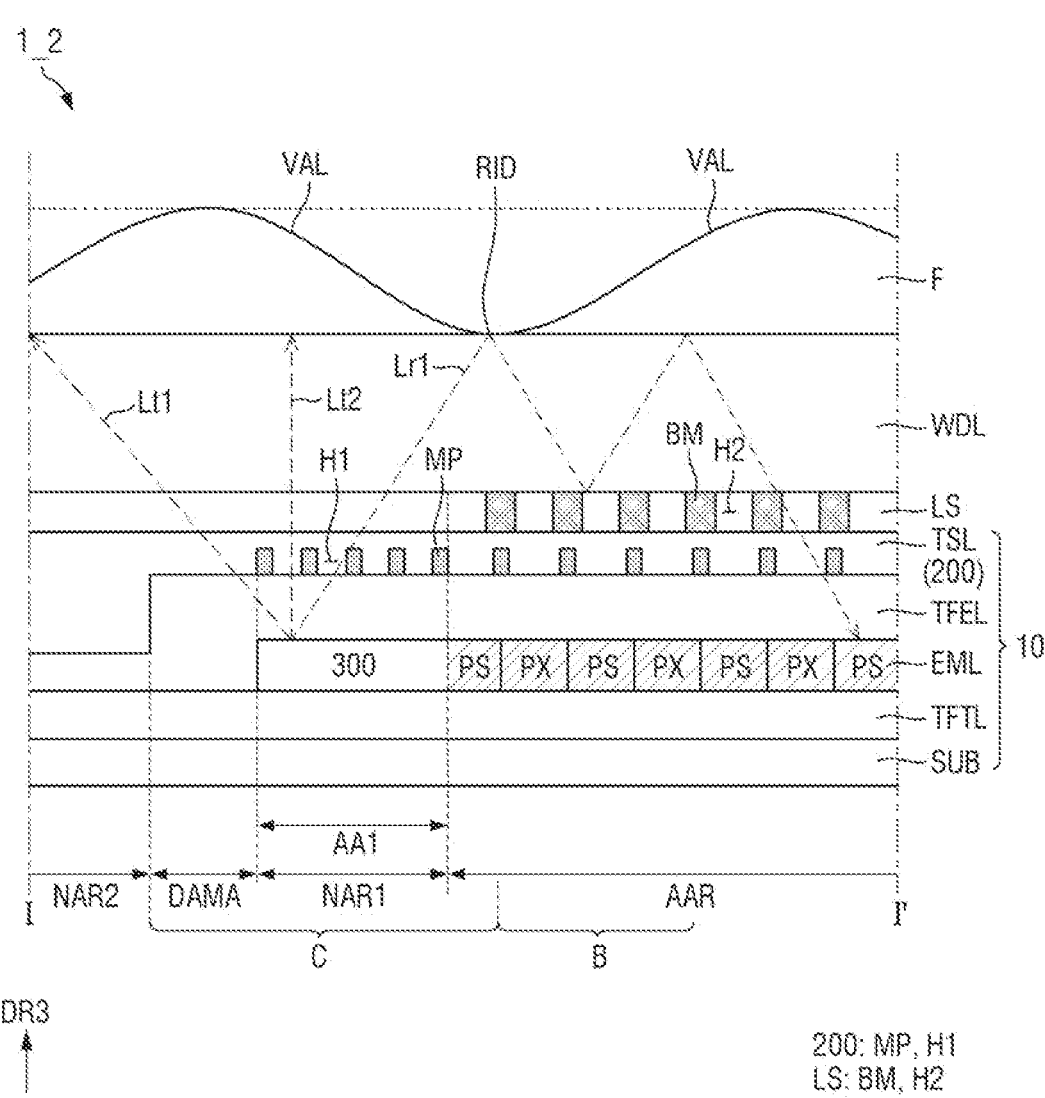
FIG. 10 is a cross-sectional view taken along line I-I' of FIG. 2 according to an embodiment of the present disclosure.
Figure 11:
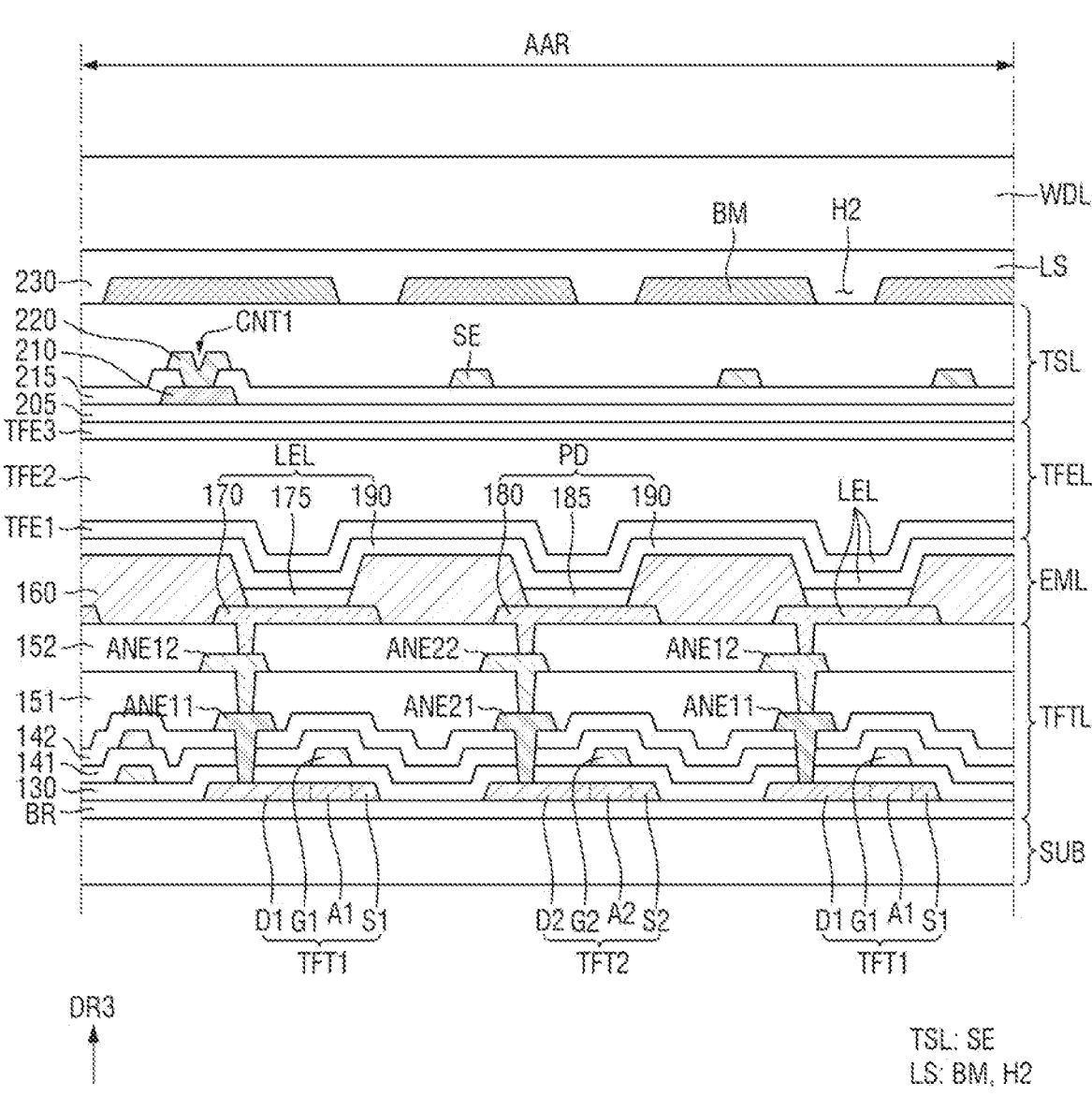
FIG. 11 is an enlarged cross-sectional view of area B of FIG. 10 according to an embodiment of the present disclosure.
Figure 12:
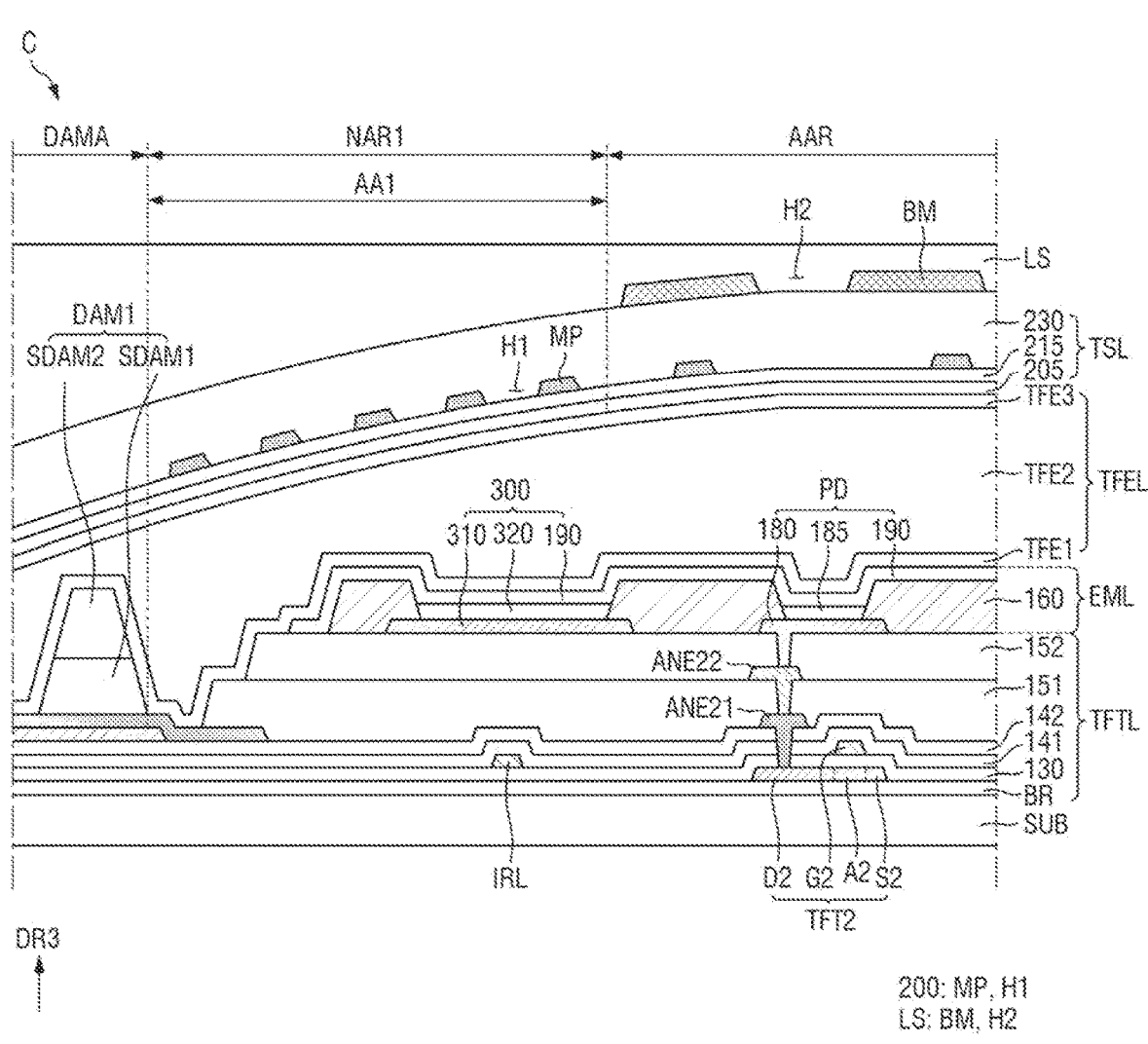
FIG. 12 is an enlarged cross-sectional view of area C of FIG. 10 according to an embodiment of the present disclosure.

Hereinafter, a display device 1_2 according to an embodiment will be described with reference to FIGS. 10 to 12. FIG. 10 is a cross-sectional view taken along line I-I' of FIG. 2 according to an embodiment. FIG. 11 is an enlarged cross-sectional view of area B of FIG. 10. FIG. 12 is an enlarged cross-sectional view of area C of FIG. 10.

Referring to FIGS. 10 to 12, in the display device 1_2 according to an embodiment, the anti-reflection layer RPL may be omitted, and a light blocking layer LS including light blocking patterns BM and second holes H2 may be further disposed on the touch sensing layer TSL.

The light blocking layer LS may be disposed on an upper side of the touch sensing layer TSL. The light blocking patterns BM of the light blocking layer LS may be disposed in the active region AAR and may be composed of a material that blocks light emission from the plurality of pixels PX. For example, in an embodiment the light blocking patterns BM may be a black matrix. As another example, the light blocking pattern BM may be a metal member. The light blocking patterns BM may adjust a light sensing area of the plurality of optical sensors PS disposed in the active region AAR. A width of the second hole H2 between the light blocking patterns BM in one direction may be less than the light emitting region of the light emitting element LEL or the light sensing region of the photoelectric conversion element PD. However, embodiments of the present disclosure are not necessarily limited thereto. The light blocking patterns BM disposed in the active region AAR may be covered by a color filter. Accordingly, color mixing between the pixels PX disposed in the active region AAR may be prevented.

The window WDL may be disposed on an upper side of the light blocking layer LS. In an embodiment, an optical adhesive layer for planarizing a top surface of the light blocking layer LS may be further disposed between the light blocking layer LS and the window WDL. However, embodiments of the present disclosure are not necessarily limited thereto.

In an embodiment, referring to FIGS. 10 and 12, the first non-active region NAR1 may include a first region AA1 in which the metal patterns MP of the first scattering pattern layer 200 and the first holes H1 are disposed. The first non-active region NAR1 may completely overlap the first region AA1.

The light source unit 300 may be disposed in the first non-active region NAR1 and the first region AA1, and may overlap the metal patterns MP of the first scattering pattern layer 200 in the third direction DR3. The light source unit 300 may be connected to the light source voltage line IRL disposed on the same layer as the second gate electrode G2 of the second thin film transistor TFT2. The light source voltage line IRL may be disposed in the first non-active region NAR1 and the first region AA1.

In the display device 1_2 according to an embodiment, by disposing the light source unit 300 functioning as a light source of the optical sensor PS in the first non-active region NAR1, the area of the active region AAR in which the pixel PX and the optical sensor PS are disposed may be increased.

In addition, by disposing the first scattering pattern layer 200 in the first non-active region NAR1, the first scattering pattern layer 200 may scatter the lights Lt1, Lt2, and Lr1 output from the light source unit 300 so that the lights Lt1, Lt2, and Lr1 are totally reflected. For example, a ratio of the transmitted light Lt1 and Lt2 may be decreased and a ratio of the total reflection light Lr1 may be increased. Since the total reflection light Lr1 contributes to the formation of the electrical signal of the optical sensor PS, a fingerprint detection accuracy of the display device 12 may increase.

Figure 13:
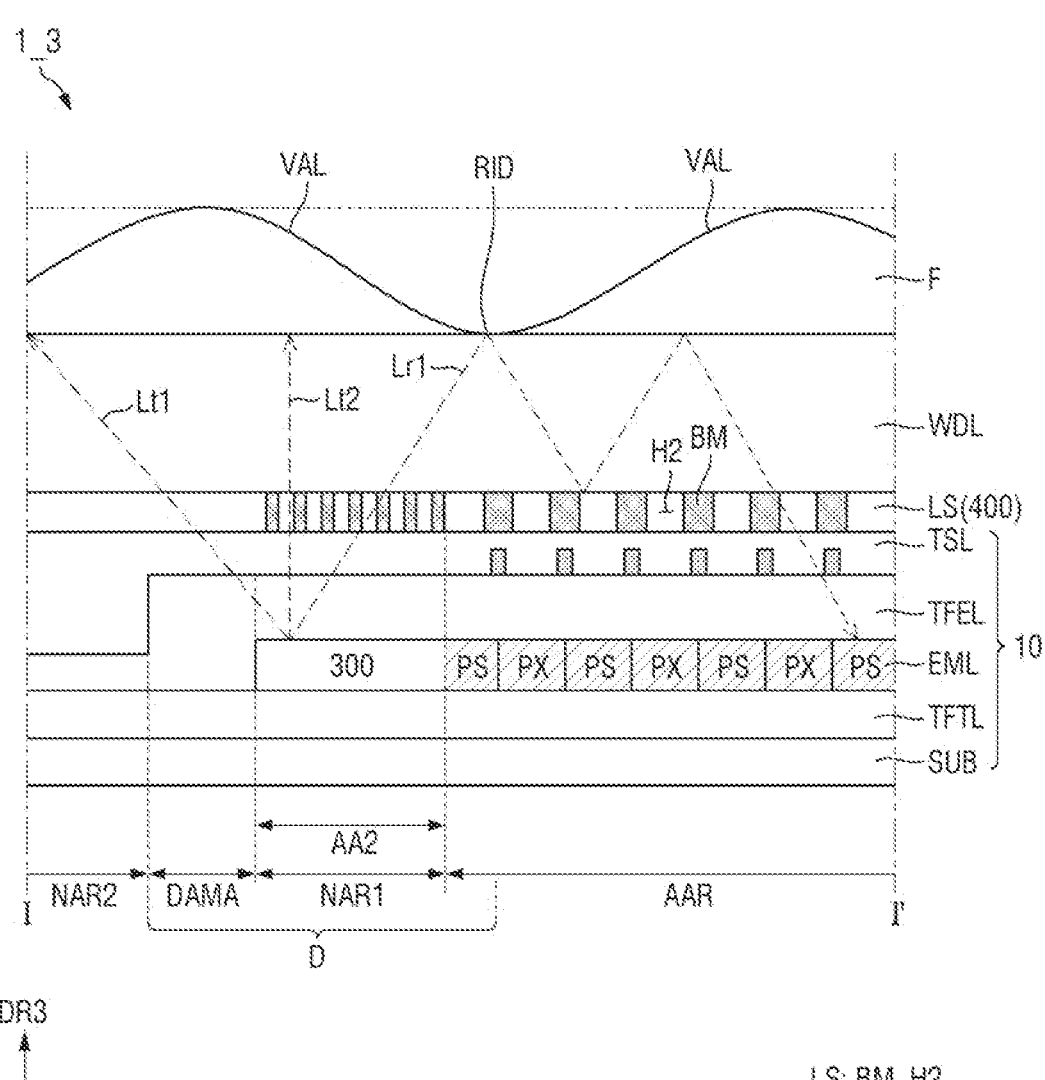
FIG. 13 is a cross-sectional view taken along line I-I' of FIG. 2 according to an embodiment of the present disclosure.
Figure 14:
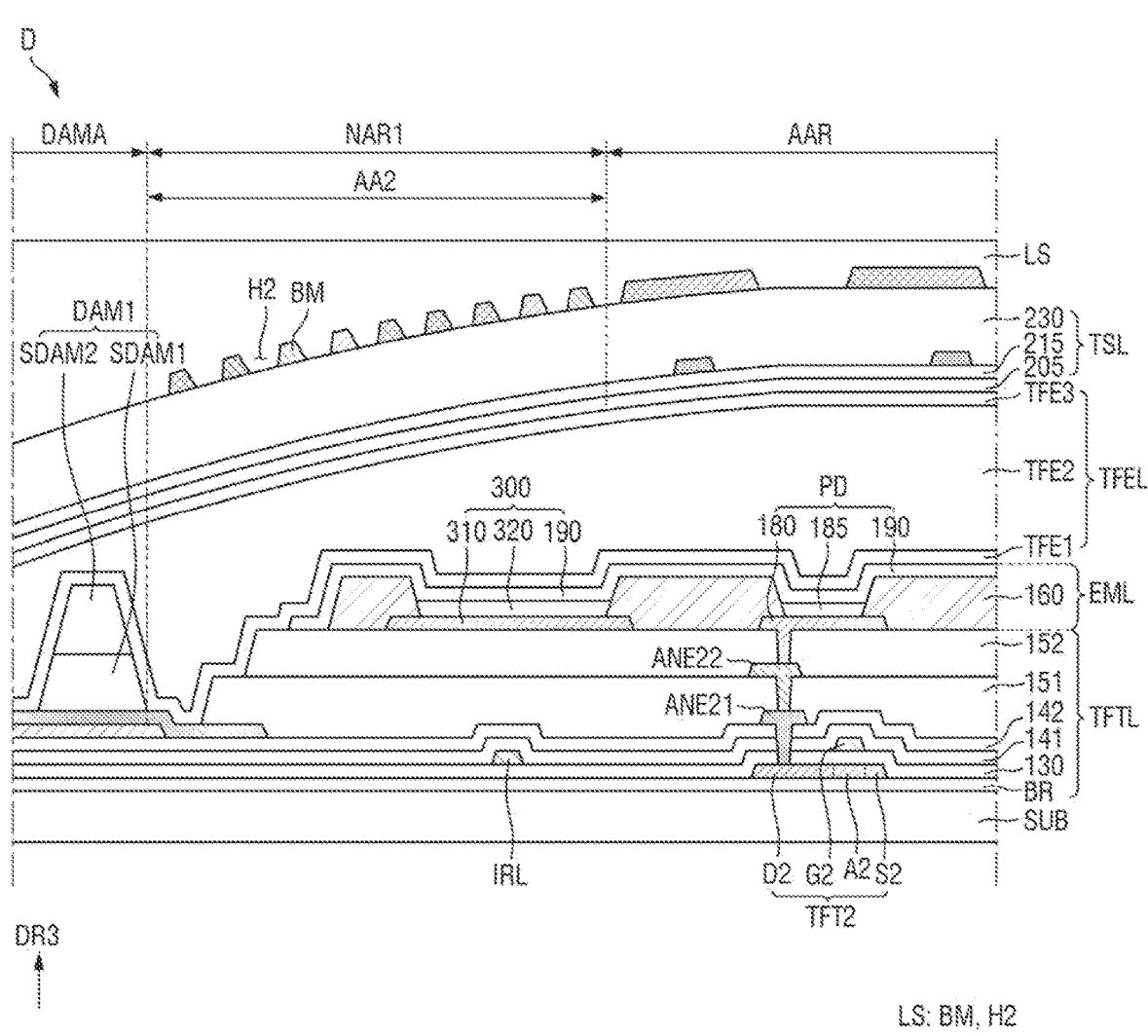
FIG. 14 is an enlarged cross-sectional view of area D of FIG. 13 according to an embodiment of the present disclosure.

Hereinafter, a display device 1_3 according to an embodiment will be described with reference to FIGS. 13 and 14. FIG. 13 is a cross-sectional view taken along line I-I' of FIG. 2 according to an embodiment. FIG. 14 is an enlarged cross-sectional view of area D of FIG. 13.

A display device 1_3 according to an embodiment is different from the display device in which the first non-active region NAR1 includes the first region AA1 according to an embodiment described with reference to FIGS. 10 to 12 in that the first non-active region NAR1 includes the second region AA2. For example, the first scattering pattern layer 200 may not be disposed in the first non-active region NAR1, and the second scattering pattern layer 400 may be disposed in the first non-active region NAR1.

In an embodiment, the second scattering pattern layer 400 may be formed of the same layer as the light blocking layer LS disposed on an upper side of the touch sensing layer TSL. The second scattering pattern layer 400 may include the light blocking patterns BM of the light blocking layer LS and the second holes H2.

The second scattering pattern layer 400 may be disposed in the second region AA2, and the second region AA2 may completely overlap the first non-active region NAR1. Accordingly, the second scattering pattern layer 400 may overlap the light source unit 300 disposed in the first non-active region NAR1 in the third direction DR3.

According to the display device 1_3 according to the present embodiment, by disposing the light source unit 300 functioning as a light source of the optical sensor PS in the first non-active region NAR1, the area of the active region AAR in which the pixel PX and the optical sensor PS are disposed may be increased.

In addition, by disposing the second scattering pattern layer 400 in the first non-active region NAR1, the second scattering pattern layer 400 may scatter the lights Lt1, Lt2, and Lr1 output from the light source unit 300 so that the lights Lt1, Lt2, and Lr1 are totally reflected. For example, a ratio of the transmitted light Lt1 and Lt2 may be decreased and a ratio of the total reflection light Lr1 may be increased. Since the total reflection light Lr1 contributes to the formation of the electrical signal of the optical sensor PS, a fingerprint detection accuracy of the display device 1_3 may increase.

Figure 15:
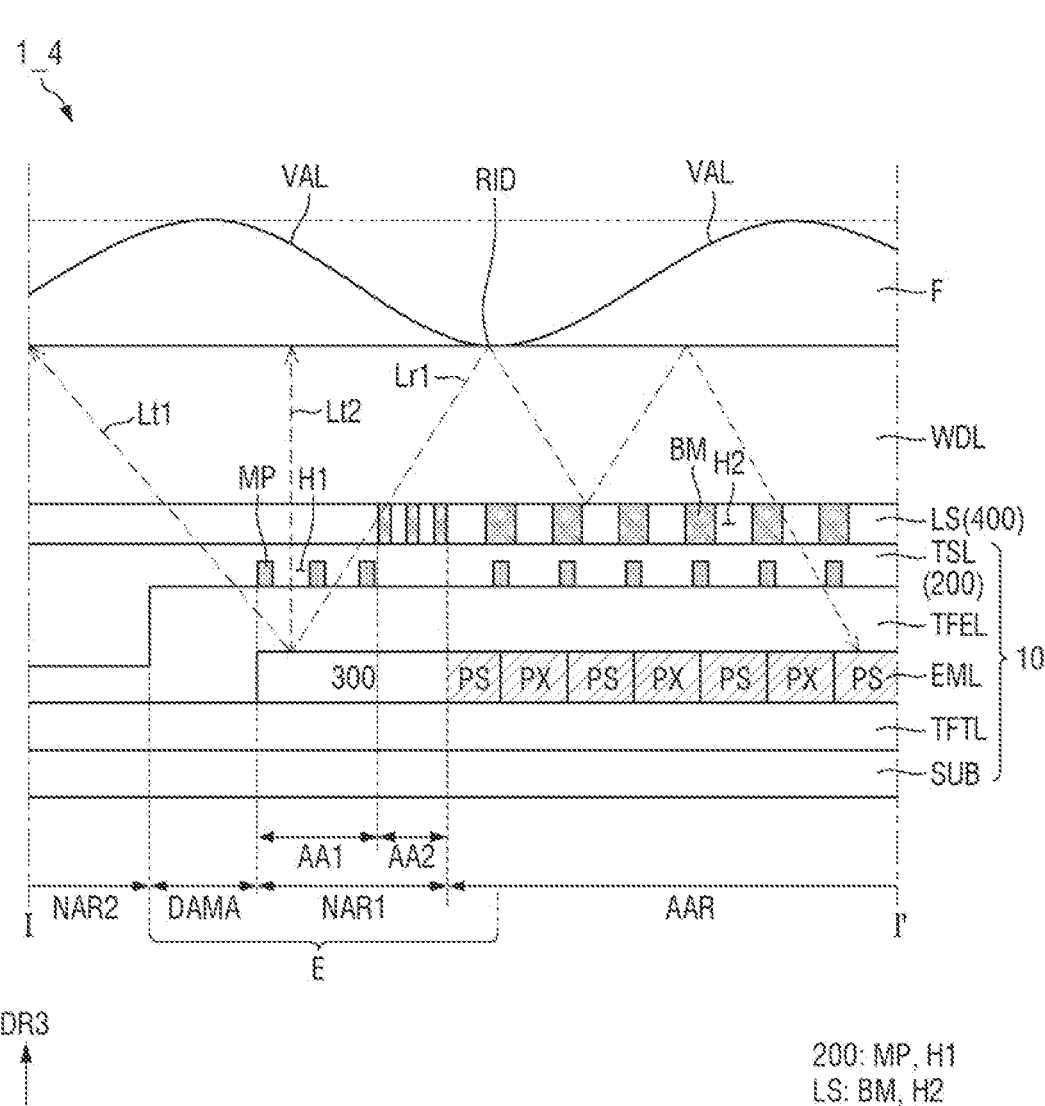
FIG. 15 is a cross-sectional view taken along line I-I' of FIG. 2 according to an embodiment of the present disclosure.
Figure 16:
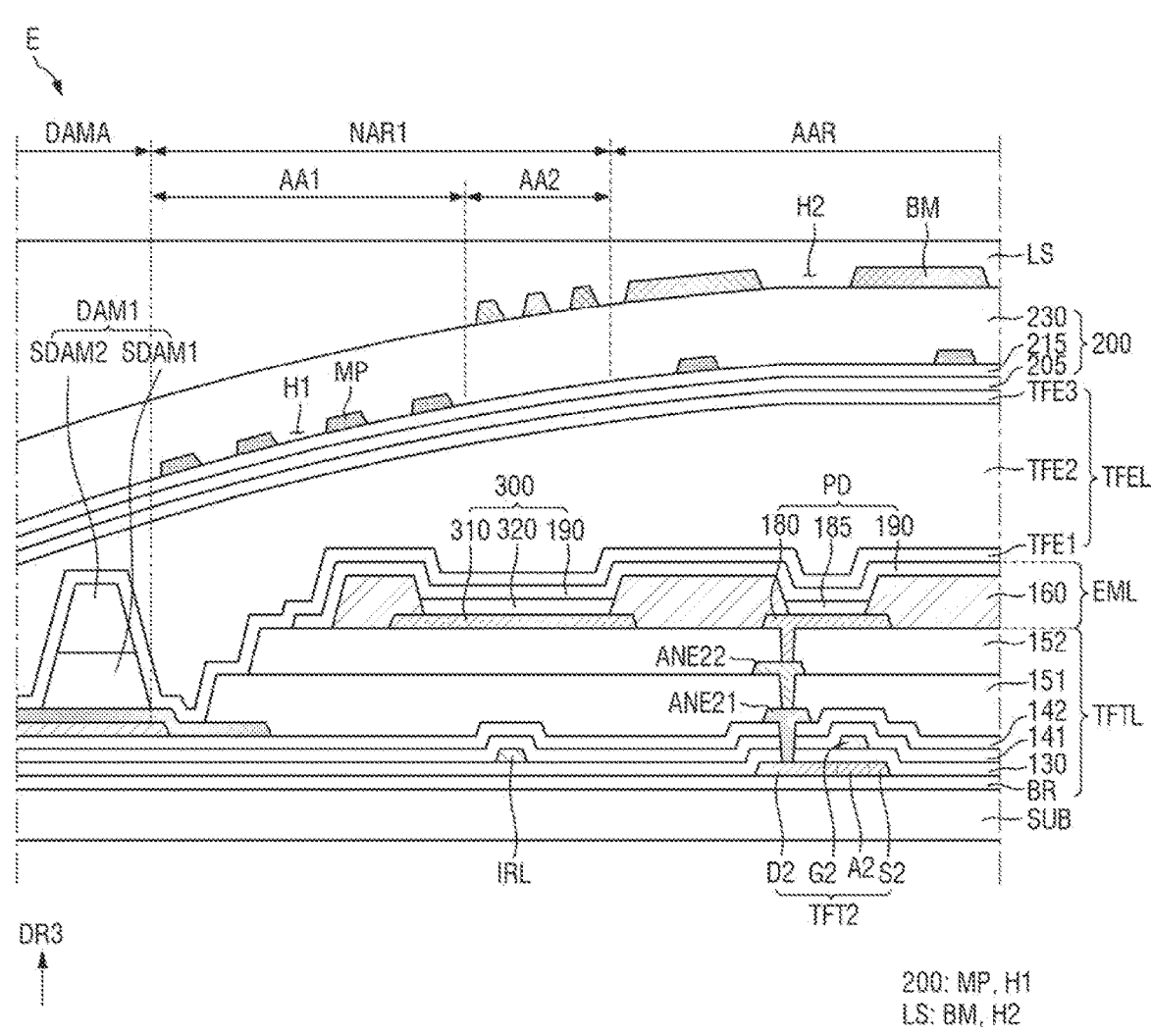
FIG. 16 is an enlarged cross-sectional view of area E of FIG. 15.

Hereinafter, a display device 1_4 according to an embodiment will be described with reference to FIGS. 15 and 16. FIG. 15 is a cross-sectional view taken along line I-I' of FIG. 2 according to an embodiment. FIG. 16 is an enlarged cross-sectional view of area E of FIG. 15.

A display device 1_4 according to an embodiment is different from the display device 1_2 in which the first non-active region NAR1 includes the first region AA1 described with referent to FIGS. 10 to 12 and the display device 1_3 in which the first non-active region NAR1 includes the second region AA2 described with referent to FIGS. 13 and 14 in that the first non-active region NAR1 includes both the first region AA1 and the second region AA2. For example, the first region AA1 of the first non-active region NAR1 may include the first scattering pattern layer 200 in which the plurality of metal patterns MP and the first holes H1 are disposed, and the second region AA2 of the first non-active region NAR1 may include the second scattering pattern layer 400 in which the plurality of light blocking patterns BM and the second holes H2 are disposed.

The first scattering pattern layer 200 and the second scattering pattern layer 400 may overlap the light source unit 300 in the third direction DR3, respectively. The first scattering pattern layer 200 and the second scattering pattern layer 400 may not overlap each other in the third direction DR3. However, embodiments of the present disclosure are not necessarily limited thereto.

In an embodiment, the first scattering pattern layer 200 may be formed of the same layer as the touch sensing layer TSL, and the metal pattern MP may include the same material as the touch electrode SE. The second scattering pattern layer 400 is formed of the same layer as the light blocking layer LS, and may include the light blocking patterns BM.

In an embodiment shown in FIG. 15, it is illustrated that the first region AA1 is adjacent to the dam region DAMA and the second region AA2 is adjacent to the active region AAR. However, embodiments of the present disclosure are not necessarily limited thereto, and it is possible to change the first region AA1 to be adjacent to the active region AAR and the second region AA2 to be adjacent to the dam region DAMA.

In the display device 1_4 according to an embodiment, by disposing the light source unit 300 functioning as a light source of the optical sensor PS in the first non-active region NAR1, the area of the active region AAR in which the pixel PX and the optical sensor PS are disposed may be increased.

In addition, by disposing the first scattering pattern layer 200 and the second scattering pattern layer 400 in the first non-active region NAR1, the first scattering pattern layer 200 and the second scattering pattern layer 400 may scatter the lights Lt1, Lt2, and Lr1 output from the light source unit 300 so that the lights Lt1, Lt2, and Lr1 are totally reflected. For example, a ratio of the transmitted light Lt1 and Lt2 may be decreased and a ratio of the total reflection light Lr1 may be increased. Since the total reflection light Lr1 contributes to the formation of the electrical signal of the optical sensor PS, a fingerprint detection accuracy of the display device 1_4 may increase.

In concluding the detailed description, those skilled in the art will appreciate that many variations and modifications can be made to embodiments without substantially departing from the principles of the present disclosure. Therefore, the disclosed embodiments of the present disclosure are used in a generic and descriptive sense only and not for purposes of limitation.

What is claimed is:

1. A display device comprising:
a substrate including an active region and a first non-active region positioned around the active region;
a plurality of pixels disposed in the active region and emitting light;
a light source unit disposed in the first non-active region and emitting light;
a plurality of optical sensors disposed in the active region and sensing incident light emitted by the light source unit;
an encapsulation layer disposed on the plurality of pixels, the plurality of optical sensors, and the light source unit; and
a scattering pattern layer disposed on the encapsulation layer in the first non-active region and having a plurality of holes.

2. The display device of claim 1, wherein:
the plurality of pixels emits light in a wavelength band of visible light; and
the light source unit emits light in an infrared wavelength band.

3. The display device of claim 2, wherein the plurality of optical sensors detect the light in the infrared wavelength band.

4. The display device of claim 1, wherein the scattering pattern layer overlaps the light source unit in a thickness direction of the substrate.

5. The display device of claim 1, further comprising a touch sensing layer disposed on the encapsulation layer in the active region, the touch sensing layer including touch electrodes;
wherein the scattering pattern layer is formed of a same layer as the touch sensing layer.

6. The display device of claim 5, wherein:
the scattering pattern layer includes metal patterns disposed between the plurality of holes; and
each of the metal patterns includes a same material as the touch electrodes of the touch sensing layer.

7. The display device of claim 1, wherein the scattering pattern layer includes light blocking patterns disposed between the plurality of holes.

8. The display device of claim 1, wherein:
the scattering pattern layer includes a first scattering pattern layer having metal patterns and a second scattering pattern layer disposed on the first scattering pattern layer and having light blocking patterns; and
the metal patterns of the first scattering pattern layer are disposed on a first region of the first non-active region and the light blocking patterns of the second scattering pattern layer are disposed on a second region of the first non-active region that is different from the first region.

9. The display device of claim 8, wherein the first scattering pattern layer and the second scattering pattern layer do not overlap each other in a thickness direction of the substrate.

10. The display device of claim 1, further comprising a second non-active region disposed outside the first non-active region,
wherein the encapsulation layer includes a first encapsulation inorganic layer, an encapsulation organic layer on the first encapsulation inorganic layer, and a second encapsulation inorganic layer on the encapsulation organic layer, and
the second non-active region includes an inorganic contact region having the first encapsulation inorganic layer and the second encapsulation inorganic layer in direct contact with each other.

11. The display device of claim 10, further comprising a dam region having at least one dam disposed between the first non-active region and the second non-active region.

12. The display device of claim 1, further comprising a light source voltage line applying a light source voltage to the light source unit,
wherein the light source voltage line is disposed in the first non-active region.

13. The display device of claim 1, wherein the first non-active region further includes a scan driver applying a scan signal to the plurality of pixels, and
the scan driver overlaps the light source unit in a thickness direction of the substrate.

14. The display device of claim 1, wherein the light source unit surrounds at least three sides of the active region.

15. A display device comprising:
a substrate including an active region and a first non-active region positioned around the active region;
a plurality of pixels disposed in the active region and emitting light;
a light source unit disposed in the first non-active region and emitting light;
a plurality of optical sensors disposed in the active region and sensing incident light emitted by the light source unit; and
an encapsulation layer disposed on the plurality of pixels, the plurality of optical sensors, and the light source unit,
wherein the plurality of pixels emits light in a wavelength band of visible light, and the light source unit emits light in a wavelength band different from the wavelength band of visible light.

16. The display device of claim 15, wherein:
the light source unit emits light in an infrared wavelength band; and
the plurality of optical sensors detects the light in the infrared wavelength band.

17. An electronic device comprising:

a substrate;

a pixel electrode, a sensing electrode and a first electrode on the substrate;

a pixel defining layer exposing the pixel electrode, the sensing electrode and the first electrode;

a first light emitting layer on the pixel electrode;

a photoelectric conversion layer on the sensing electrode;

a second light emitting layer on the first electrode; and a common electrode disposed on the first light emitting layer, the photoelectric conversion layer, the second light emitting layer and the pixel defining layer, wherein the second light emitting layer includes a material different from that of the first light emitting layer.

18. The electronic device of claim 17, further comprising:

an encapsulation layer on the common electrode; and a scattering pattern layer on the encapsulation layer, wherein the scattering pattern layer overlaps the second light emitting layer in a thickness direction of the substrate.

19. The electronic device of claim 17, wherein a thickness of the first light emitting layer is less than a thickness of the second light emitting layer.

20. The electronic device of claim 17, wherein a thickness of the common electrode disposed on the first light emitting layer is less than a thickness of the common electrode disposed on the second light emitting layer.

\* \* \* \* \*